(12) United States Patent
Katakura

(10) Patent No.: US 7,522,691 B2
(45) Date of Patent: Apr. 21, 2009

(54) PHASE-LOCKED CIRCUIT

(75) Inventor: Masayuki Katakura, Kanagawa (JP)

(73) Assignee: Sony Corporation (JP)

( * ) Notice: Subject to any disclaimer, the term of this patent is extended or adjusted under 35 U.S.C. 154(b) by 614 days.

(21) Appl. No.: 11/137,642

(22) Filed: May 26, 2005

(65) Prior Publication Data

US 2005/0271180 A1 Dec. 8, 2005

(30) Foreign Application Priority Data

Jun. 4, 2004 (JP) ............................. P2004-166998

(51) Int. Cl.
*H03D 3/24* (2006.01)
(52) U.S. Cl. ....................... 375/376; 375/344
(58) Field of Classification Search ................ 375/376, 375/364; 327/156
See application file for complete search history.

(56) References Cited

U.S. PATENT DOCUMENTS

| | | | | |
|---|---|---|---|---|
| 5,574,755 | A * | 11/1996 | Persico | 375/295 |
| 6,081,563 | A * | 6/2000 | Taga et al. | 375/344 |
| 2002/0001361 | A1* | 1/2002 | Ueno et al. | 375/376 |
| 2005/0057289 | A1* | 3/2005 | Pham | 327/156 |
| 2006/0164137 | A1* | 7/2006 | Van De Beek et al. | 327/156 |
| 2007/0241782 | A1* | 10/2007 | Teig et al. | 326/41 |

FOREIGN PATENT DOCUMENTS

| | | |
|---|---|---|
| JP | 05-041662 | 2/1993 |
| JP | 08-204599 | 8/1996 |

OTHER PUBLICATIONS

Japanese Office Action No. 2004-166998 ~ Dated: Oct. 16, 2007.

* cited by examiner

*Primary Examiner*—David C Payne
*Assistant Examiner*—Tanmay K Shah
(74) *Attorney, Agent, or Firm*—Rader Fishman & Grauer PLLC; Ronald P. Kananen

(57) ABSTRACT

A phase-locked circuit comprises a complex signal processor and a feedback portion wherein the complex signal processor: receives as an input a first complex signal composed of a real part component and an imaginary part component; generates a second complex signal composed of a first signal component and a second signal component and having a second frequency in accordance with a feedback control signal input from the feedback portion; and generates a signal in accordance with a declination of a third complex signal obtained by multiplying the first complex signal with the second complex signal and outputs to the feedback portion. The feedback portion generates the feedback control signal in accordance with a signal input from the complex signal processor, so that the declination converges to a constant value; and the complex signal processor synchronizes a phase of the second complex signal with the first complex signal and outputs.

14 Claims, 24 Drawing Sheets

FIG. 6
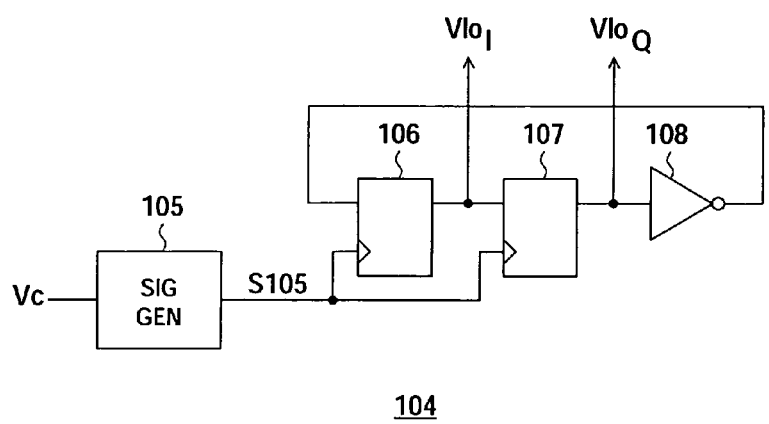
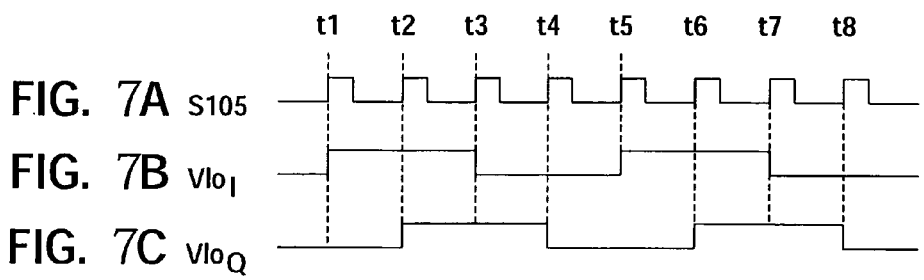
FIG. 7A S105
FIG. 7B Vlo_I
FIG. 7C Vlo_Q

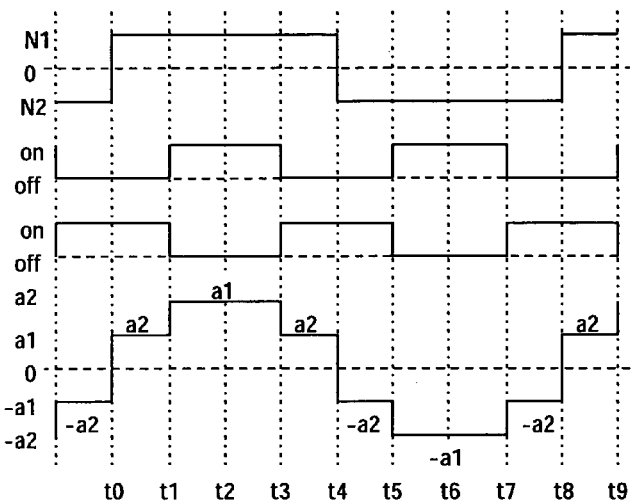
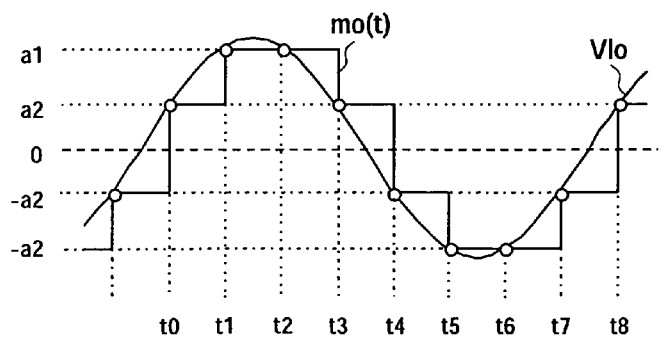

FIG. 27
$V_I = V_0 \cos\omega_0 t \cos\theta_{(t)}$ $\qquad\qquad$ $V_I = V_0 \cos\omega_0 t \cos\theta_{(t)}$
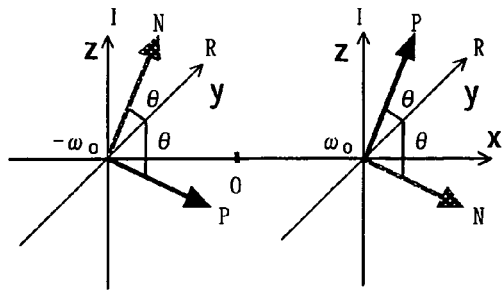 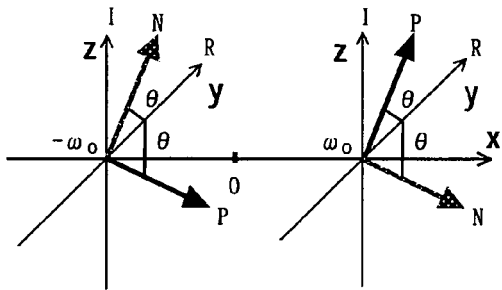
$-$SUB $\qquad\qquad\qquad\qquad$ $+$APP
$-j \cdot V_Q = -j \cdot V_0 \cos\omega_0 t \sin\theta_{(t)}$ $\qquad$ $-j \cdot V_Q = -j \cdot V_0 \cos\omega_0 t \sin\theta_{(t)}$
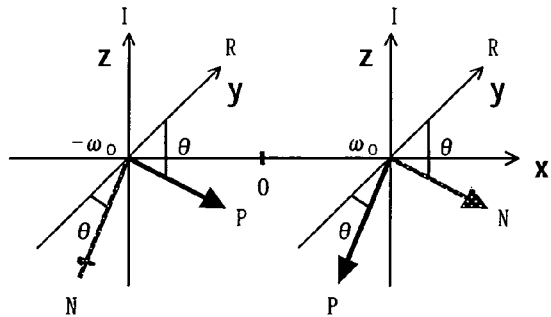 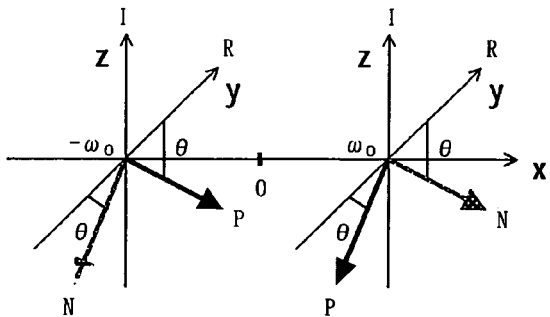
 
RESULT $V_{CP}$ $\qquad\qquad\qquad\qquad$ RESULT $V_{CN}$
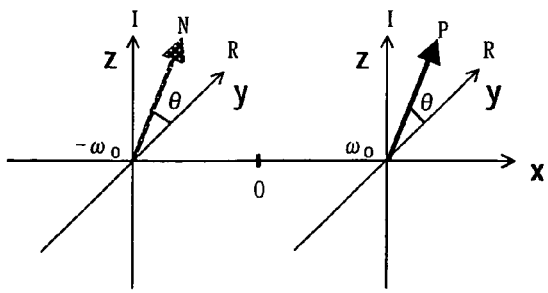 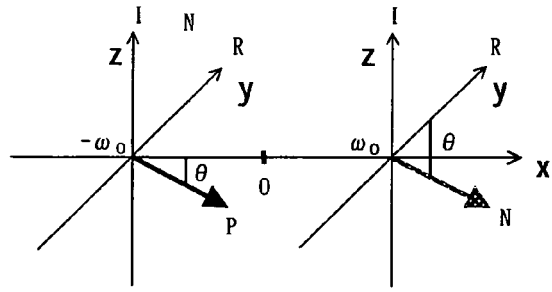

FIG. 31
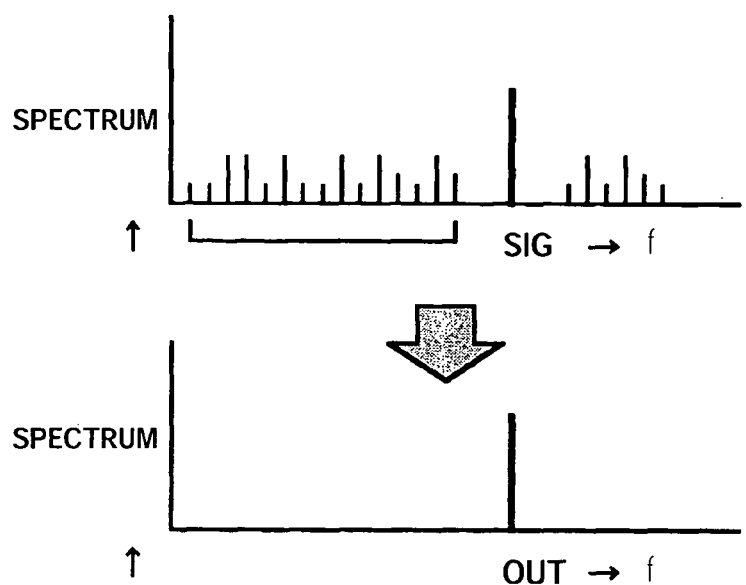
FIG. 32A
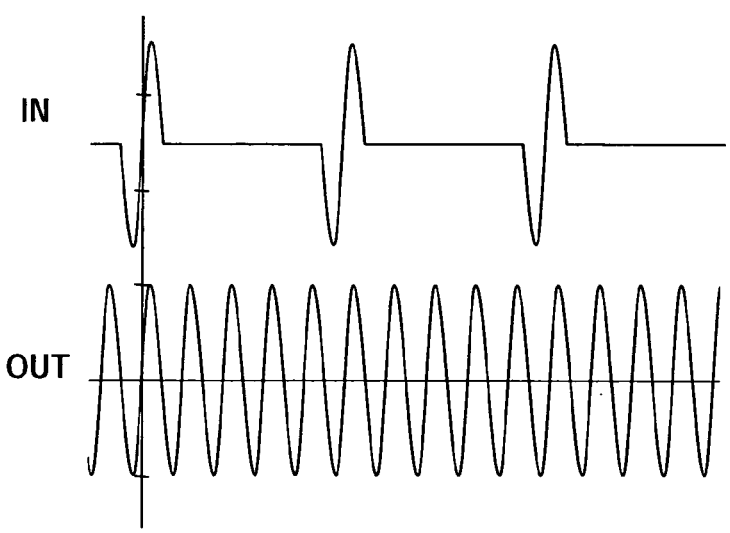
FIG. 32B

PHASE-LOCKED CIRCUIT

CROSS REFERENCES TO RELATED APPLICATIONS

The present invention contains subject matter related to Japanese Patent Application JP 2004-166998 filed in the Japanese Patent Office on Jun. 4, 2004, the entire contents of which being incorporated herein by reference.

BACKGROUND OF THE INVENTION

1. Field of the Invention

The present invention relates to a phase-locked circuit for outputting a signal, wherein a phase thereof is locked to an input signal.

2. Description of the Related Art

When using a phase-locked loop (PLL), for example as shown in FIG. 31, from a signal buried in an interfering wave, an output locked (synchronized) to a phase of the signal can be taken out. In this case, even if a frequency of the signal is changed by a Doppler-shift, etc., the PLL can follow the frequency change, and this is a different point from a mere filter.

Also, the phase-locked loop is effectively used also in the case of recovering a continuous signal shown in FIG. 32B from signals sent in a burst state, for example as shown in FIG. 32A. This is used for reproducing a color carrier wave, for example, in analog TV broadcast in the NTSC method, etc.

The phase-locked loop is also widely used for frequency synthesis. FIG. 33 is a basic block diagram of a frequency synthesis circuit (frequency synthesizer).

In this circuit, an oscillation frequency of a VCO (voltage controlled oscillation circuit) 4 is controlled, so that a reference frequency multiplied by 1/N "freq/N" and an output frequency $f_{OUT}$ multiplied by 1/M "freq/M" become equal by obtaining a phase difference $\Delta\phi$ of the both by a phase comparison band 2 via a LPF 3. As a result, the output frequency $f_{OUT}$ becomes "M×$f_{REF}$/N". By changing a division ratio M, it becomes possible to adjust the output frequency $f_{OUT}$ by resolution of $f_{REF}$/N. The frequency synthesis circuit composed of a phase-locked loop is widely used for finely adjusting frequency in measuring devices and ratio communication apparatuses, etc.

A real number "a" is obtained by adding two conjugate complex numbers and dividing by 2, wherein the two conjugate complex numbers have positive and negative declinations having an equal size. In totally the same way, a real signal used in signal processing can be considered as a signal obtained by adding two complex signals having positive and negative frequencies.

In the case of performing processing relating to a frequency, such as frequency conversion processing and filter processing, on a real signal as above, two complex signals in positive and negative frequency domains may interfere.

For example, in a communication apparatus, etc., frequency conversion processing for taking out a signal of an intermediate frequency "$\omega_{IF}=\omega_{RF}-\omega_{LO}$" by multiplying a high frequency signal of an angle frequency "$\omega_{RF}=2\pi f_{RF}$" and a local oscillation signal of an angle frequency $\omega_{LO}=2\pi f_{LO}$" by the real signals is often performed. In this processing, as shown in FIG. 34, an image signal existing in an angle frequency $\omega_{image}=\omega_{LO}-\omega_{IF}$ also shifts to the intermediate frequency $\omega_{IF}$ in the same way as the high frequency signal to be processed, so that it suffers from a disadvantage that it disturbs the communication. It is considered that this is because a complex signal of a negative angle frequency $-\omega_{image}$ included in the image signal shifts from a negative frequency domain to a positive frequency domain by being multiplied with a complex signal of a positive angle frequency $\omega_{LO}$ included in the local oscillation signal to bring a frequency shift of "$-\omega_{image}+\omega_{LO}$".

In a phase-locked loop, only a real signal is capable of locking a phase, and positive and negative frequency components cannot be distinguished for use. Therefore, the interference of positive and negative frequency components cannot be fundamentally prevented and it suffers form disadvantages of causing complication of the circuit and a decline of quality of an output signal, etc.

SUMMARY OF THE INVENTION

It is desired to provide a phase-locked circuit capable of using by distinguishing positive and negative frequency components.

According to a first embodiment of the present invention, there is provided a phase-locked circuit for locking a phase of an output signal to an input signal, comprising a complex signal processor, and a feedback portion.

The complex signal processor generates a signal in accordance with a declination of a third complex signal obtained by multiplying a second complex signal having a frequency in accordance with a feedback control signal to be input, wherein the frequency is set to have a predetermined polarity, with a first complex signal as the above input signal. Also, at least one of a first signal component and a second signal component having mutually perpendicular phases included in the second complex signal or a signal synchronized with the signal component is output as the above output signal.

The feedback portion generates the feedback control signal in accordance with a signal input from the complex signal processor, so that the declination converges to a constant value The second complex signal has a frequency in accordance with the feedback control signal, wherein the frequency has a predetermined polarity. A signal in accordance with a declination of a complex signal obtained by multiplying the second complex signal with the first complex signal is generated in the complex signal processor.

The declination of a complex signal obtained by multiplying the second complex signal with the first complex signal is equal to a declination obtained by adding a declination of the first complex signal and that of the second complex signal. Therefore, in the complex signal processor, a signal in accordance with the added declination is generated.

In the feedback portion, the feedback control signal for controlling feedback is generated in accordance with a signal generated in the complex signal processor, so that the added declination converges to a constant value (for example, zero).

A declination becoming constant is equivalent to a declination being constant over time and a frequency becoming zero. Accordingly, to converge the added declination to a constant value, it is necessary that the first complex signal and the second complex signal have frequencies of the same size but opposite polarities.

Therefore, when the second complex signal has a negative frequency, the frequency of the second complex signal is controlled, so that the negative frequency cancels out a positive frequency of the first complex signal. When the second complex signal has a positive frequency, the frequency of the second complex signal is controlled, so that the positive frequency cancels out a negative frequency of the first complex signal.

Inversely, when the second complex signal and the first complex signal have frequencies of the same polarity, the added declination always has a frequency and it cannot be converged to a constant value. Therefore, in this case, the feedback control is not operated and a frequency of the second complex signal does not follow a frequency of the first complex signal.

Accordingly, in the output signal, which is at least one of the first signal component and the second signal component in the second complex signal or a signal synchronized with the signal component, a phase is locked to the first complex signal having a frequency of an opposite polarity of a predetermined polarity as above.

A second embodiment of the present invention is a phase-locked circuit for locking a phase of an output signal to a signal having a frequency shifted exactly by an amount of a second frequency from a signal having a first frequency included in an input signal, and includes a quadrature signal generation portion, a first complex signal output portion, a complex signal processor, and the phase-locked circuit of the first embodiment.

The quadrature signal generation portion generates two quadrature signals having the second frequency and mutually perpendicular phases.

The first complex signal output portion multiplies two quadrature signals generated by the quadrature signal generation portion respectively with the input signal, performs on two signals as the multiplication results filter processing for attenuating components at a higher frequency or a lower frequency than the first frequency exactly by an amount of the second frequency, and outputs a first complex signal wherein one of two signals after the filter processing is a real part component and the other is an imaginary part component. The phase-locked circuit of the first embodiment locks a phase of an output signal to the first complex signal.

In the first complex signal output portion, the input signal is multiplied respectively with two quadrature signals having the second frequency generated by the quadrature signal generation portion. Two signals as multiplication results indicate one complex signal, wherein one is a real part and the other is an imaginary part, and this complex signal becomes what obtained by shifting a frequency of the input signal exactly by an amount of the second frequency to the positive or negative direction.

Next, in the first complex signal output portion, filter processing for attenuating signal components at a higher frequency or a lower frequency than the first frequency exactly by an amount of the second frequency is performed on two signals as the multiplication results. As a result, among positive and negative frequency components originally included in the input signal, those moved to one side of a high range and a low range due to the frequency shift are removed, and those moved to the other side remain.

The complex signal after the filter processing is input as the first complex signal to a phase-locked circuit having the same configuration as that in the first embodiment.

Original components of the input signal remain as they are in one of frequency domains, high or low, not attenuated by the filter processing. Therefore, when locking a phase by using only a real part or an imaginary part of the first complex signal, it is interfered by a frequency component of an opposite sign-existing symmetrically about a frequency-zero point. On the other hand, when using the phase-locked circuit of the first embodiment, an output signal having a phase locked to a component having one of positive and negative frequencies is obtained from frequency components included in the first complex signal, thus, it is not affected by an interference as such.

A third embodiment of the present invention is a phase-lock circuit for locking a phase difference of a first output signal and a second output signal to a phase difference in accordance with a first angle based on a first input signal being proportional to a product of a cosine function having a first frequency and a cosine function having the first angle, and a second input signal being proportional to a product of a cosine function having a first frequency and a sine function having the first angle, and comprises a polarity inversion circuit, a first phase lock circuit and a second phase lock circuit.

The polarity inversion circuit inverts a polarity of the second input signal and outputs.

In the first phase-locked circuit, the first input signal is input to a first terminal, the second input signal is input to a second terminal, and the first output signal is output.

In the second phase-locked circuit, the first input signal is input to a first terminal, an output signal of the polarity inversion circuit is input to second terminal, and the second output signal is output The first phase-locked circuit and the second phase-locked circuit have the same configuration (a complex signal processor and a feedback portion) as that in the first embodiment.

Note that in the complex signal processors of the respective phase-locked circuits, a complex signal having a signal input to the first terminal as a real part component and a signal input to the second terminal as an imaginary part component is used as the first complex signal.

Also, the complex signal processor outputs as the first output signal or the second output signal at least one of a first signal component and a second signal component having mutually perpendicular phases included in the second complex signal, or outputs as the first output signal or the second output signal a signal synchronized with one of the first signal component and the second signal component.

The first phase-locked circuit receives as an input a complex signal, wherein the first input signal is a real part component and the second signal is an imaginary part component. This complex signal has the first frequency and positive and negative frequency components having opposite signs.

Also, the second phase-locked circuit receives as an input a complex signal, wherein the first input signal is a real part component and a polarity inverted signal of the second signal is an imaginary part component. This complex signal also has the first frequency and positive and negative frequency-components having opposite signs.

When comparing signal components having frequencies of the same polarity between the complex signals input to the first and second phase-locked circuits, both of the positive and negative frequencies have a phase difference in accordance with the first angle.

Both of a first output signal to be output from the first phase-locked circuit and a second output signal to be output from the second phase-locked circuit become a signal having a phase locked to a component having a frequency of a specific polarity (an opposite polarity of the predetermined polarity) included in the first complex signal. Therefore, a phase difference of the both is locked to a phase difference in accordance with the first angle.

Note that the first to third embodiments may be configured as below.

The complex signal processor may generate a signal in accordance with a real part or an imaginary part of a complex signal obtained by multiplying the first complex signal with the second complex signal as a signal in accordance with the declination, and the feedback portion may generate the feedback control signal for controlling feedback, so that a signal generated in the complex signal processor converges to a constant value.

In this case, a signal generated in the complex signal processor is a signal in accordance with a real part component or an imaginary part component in a complex signal having a declination obtained by adding a declination of the first complex signal and that of the second complex signal. As a result of controlling feedback, so that the signal converges to a constant value, the added declination converges to a constant value.

The complex signal processor may include a complex signal generation portion, a first calculation portion, a second calculation portion and a third calculation portion.

The first calculation portion multiplies the first signal component generated by the complex signal generation portion with a real part component of the first complex signal.

The second calculation portion multiplies the second signal component generated by the complex signal generation portion with an imaginary part component of the first complex signal.

The third calculation portion calculates a sum or difference of multiplication results of the first calculation portion and the second calculation portion.

According to the above configuration, the complex signal generation portion generates the first signal component and the second signal component having a frequency in accordance with the feedback control signal, phases of which are mutually perpendicular. In the first calculation portion, the first signal component generated by the complex signal generation portion is multiplied with a real part component of the first complex signal. In the second calculation portion, the second signal component generated by the complex signal generation portion is multiplied with an imaginary part component of the first complex signal. In the third calculation portion, a sum or difference of multiplication results of the first calculation portion and the second calculation portion is calculated A calculation result of the sum or difference becomes a signal corresponding to a real part or an imaginary part of a complex signal obtained by multiplying the first complex signal with the second complex signal.

Alternately, the complex signal processor may include a signal generation portion, a fourth calculation portion, a fifth calculation portion and a sixth calculation portion.

The signal generation portion generates a signal having a frequency in accordance with the feedback control signal.

The fourth calculation portion selects for each cycle of a signal generated by the signal generation portion a coefficient value in accordance with an instantaneous value for the first signal component to have in the cycle from a plurality of predetermined coefficient values, and multiplies the selected coefficient value with a real part component of the first complex signal. Consequently, a pseudo result of multiplying the first signal component with a real part component of the first complex signal is obtained.

The fifth calculation portion selects for each cycle of a signal generated by the signal generation portion a coefficient value in accordance with an instantaneous value for the second signal component to have in the cycle from a plurality of predetermined coefficient values, and multiplies the selected coefficient value with an imaginary part component of the first complex signal. Consequently, a pseudo result of multiplying the second signal component with an imaginary part component of the first complex signal is obtained.

Then, as a result that the sixth calculation portion calculates a sum or difference of multiplication results of the fourth calculation portion and the fifth calculation portion, a signal corresponding to a real part or an imaginary part of a complex signal obtained by multiplying the first complex signal with the second complex signal is obtained.

According to the present invention, it is possible to obtain a signal wherein a phase is locked only to either one of components having positive and negative frequencies included in a complex signal to be input, so that positive and negative frequency components can be distinguished for use, and the mutual interference can be prevented.

BRIEF DESCRIPTION OF DRAWINGS

These and other objects and features of the present invention will become clearer from the following description of the preferred embodiments given with reference to the attached drawings, in which:

FIG. 6 is a view of an example of the configuration of a complex signal generation portion in the phase-locked circuit shown in FIG. 1;

FIG. 7A to FIG. 7C show signal waveforms of respective portions in the complex signal generation portion shown in FIG. 6;

FIG. 11A to FIG. 11D are views of a control example of respective switches of the sine wave multiplier shown in FIG. 10 in the case where there are two multiplier coefficients;

FIG. 12 is a view of an example of a relationship of changes of a multiplier coefficient value selected in time series and a sine wave signal to be multiplied;

FIG. 27 is a view wherein complex signal processing performed in the present embodiment is illustrated by vectors;

FIG. 31 is a view of an example of taking out a signal from an interference wave by using a PLL;

FIG. 32A and FIG. 32B are views of an example of reproducing a carrier wave signal from a burst signal by using a PLL;

DESCRIPTION OF THE PREFERRED EMBODIMENT

Below, preferred embodiments of the present invention will be explained with reference to the drawings.

First Embodiment

Figure 1:
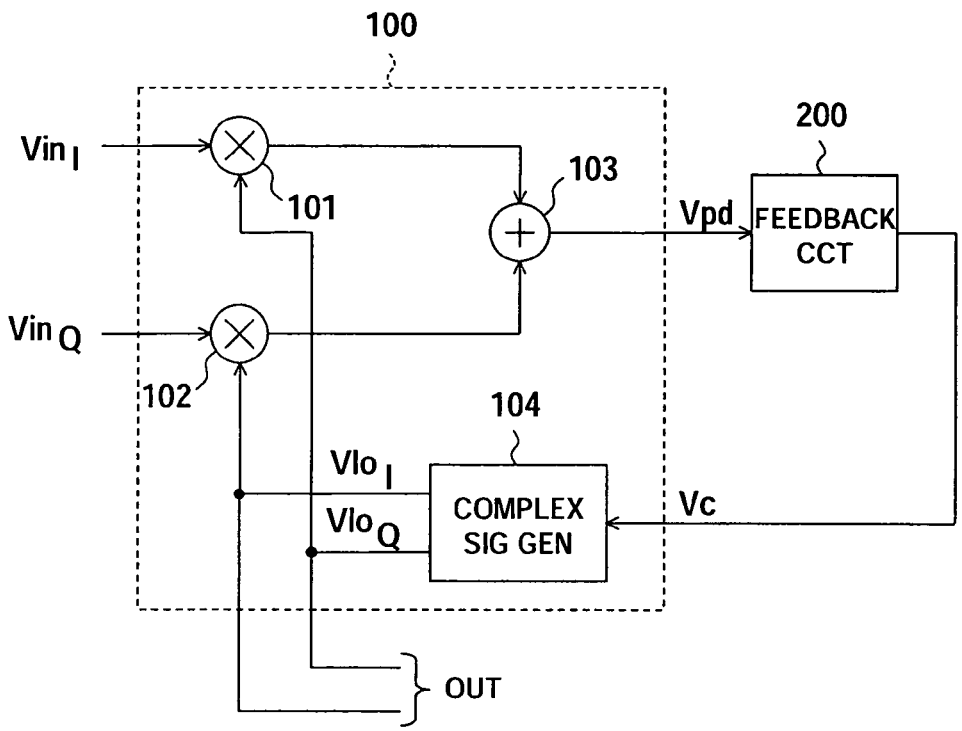
FIG. 1 is a view of an example of the configuration of a phase-locked circuit according to a first embodiment.

FIG. 1 is a view of an example of the configuration of a phase-locked circuit according to a first embodiment of the present invention.

Before explaining the phase-locked circuit shown in FIG. 1, a relationship of a real signal and a complex signal will be explained.

A complex frequency $\omega_S$ is defined as below.

$$e^{j\omega_s t} = \cos \omega_s t + j \cdot \sin \omega_s t \tag{1}$$

Since a complex signal is defined on a complex plane, it can be divided to a real part $\cos \omega_s t$ and an imaginary part $\sin \omega_s t$ and defined as a set of two signals.

Figure 2:
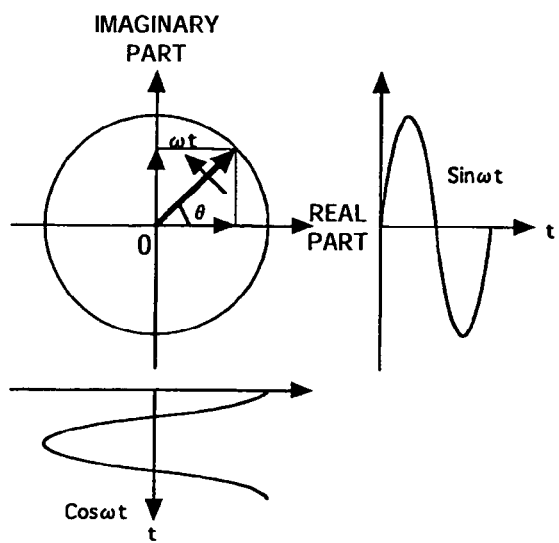
FIG. 2 is a view of a complex signal expressed on a complex plane.

FIG. 2 is a view of a complex signal expressed on a complex plane.

A complex signal can be considered as a vector on a complex plane rotating about an origin "o" at an angle rate ω. A real part of the complex signal is a cosine component and an imaginary part is a sine component.

Against such a complex signal, a normal signal is called as a real signal.

When considering real signals of a sine wave and a cosine wave as complex signals, how they can be expressed as complex signals will be discussed below. A sine wave and a cosine wave as real signals can be expressed as below.

$$\cos \omega_s t = \frac{e^{j\omega_s t} + e^{-j\omega_s t}}{2} \tag{2}$$

$$\sin \omega_s t = \frac{e^{j\omega_s t} - e^{-j\omega_s t}}{2j} \tag{3}$$

As is obvious from the formula (2), a real signal is expressed by a sum of two complex signals having symmetric frequencies to the positive and negative sides.

Figure 3A:
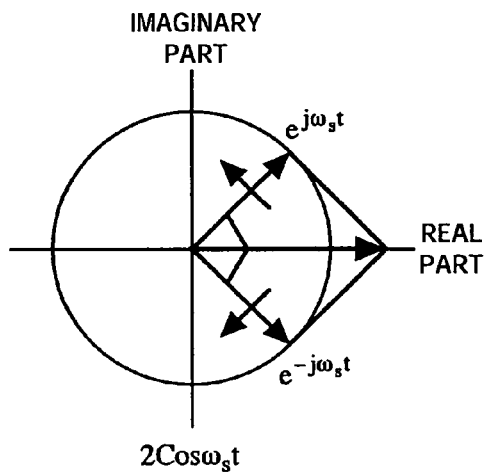
FIG. 3A and FIG. 3B are views wherein a real signal is expressed by a vector on a complex plane.
Figure 3B:
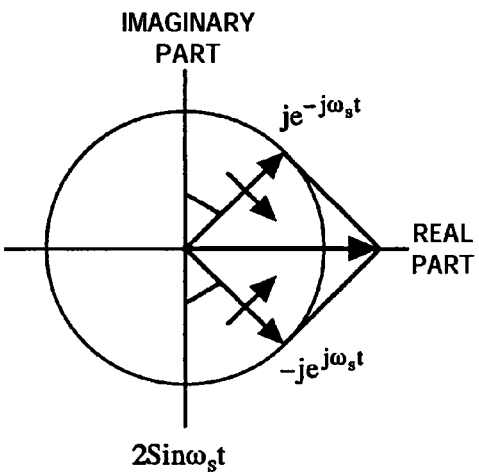

It is defined that a positive frequency is a vector rotating in the anticlockwise direction and a negative frequency is a vector rotating in the clockwise direction on the complex plane in FIG. 2. When illustrating a relationship of the formulas (2) and (3) based on the definition, it is as shown in FIG. 3.

A real signal 2 Cos $\omega_s t$ is a sum of a complex signal $e^{j\omega_s t}$ having a positive frequency and a complex signal $e^{-j\omega_s t}$ having a negative frequency. When illustrating it on the complex plane, as shown in FIG. 3A, it can be expressed as a sum of two vectors rotating inversely to each other. The two vectors superimpose on a real axis at time t=0 and are always axisymmetric about the real axis even when rotating over time. Therefore, when merging the two vectors, the imaginary part is always cancelled to be zero and only the real part remains.

In the same way, a real signal 2 Sin $\omega_s t$ is a sum of a complex signal $je^{j\omega_s t}$ having a positive frequency and a complex signal $je^{-j\omega_s t}$ having a negative frequency, which are axisymmetric about the real axis. Therefore, when merging the two vectors, the imaginary part is also always cancelled to be zero and only the real part remains.

Figure 4:
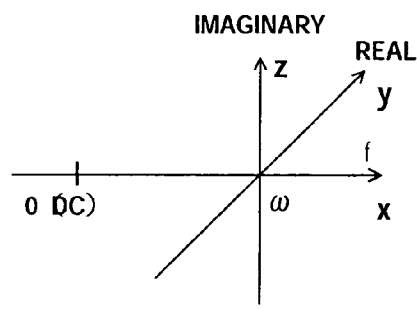
FIG. 4 is a view of a coordinate system for expressing a vector of a complex signal by using frequency axes.

To express it as a stationary vector, the coordinate system shown in FIG. 4 will be used.

In the coordinate system in FIG. 4, an x-axis indicating an angle frequency or a frequency of a complex signal is provided in the vertical direction with respect to the complex plane made by a Z-axis indicating an imaginary part and a y-axis indicating a real part.

Figure 5A:
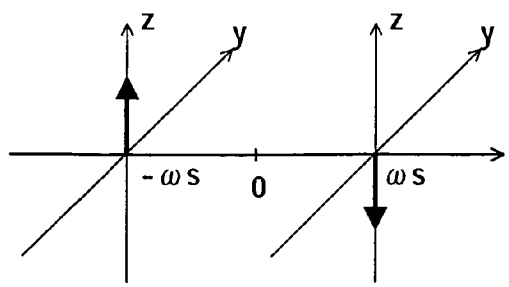
FIG. 5A and FIG. 5B are views for illustrating a sine wave signal and a cosine wave signal when time t=0 by a vector on a complex plane.
Figure 5B:
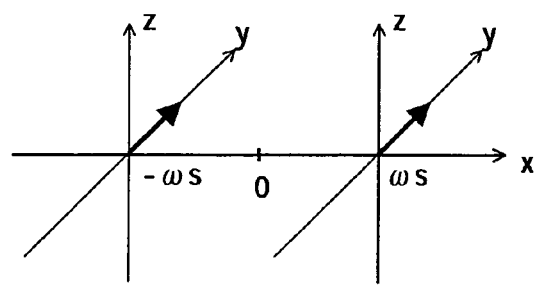

FIG. 5 is a view of illustrating a sine wave signal and a cosine wave signal at time t=0 by vectors on the complex plane (z-y plane). Note that a phase at time t=0 is assumed to be zero in all cases. FIG. 5A shows vectors of a cosine wave signal $\cos \omega_s t$, and FIG. 5B shows vectors of a sine wave signal $\sin \omega_s t$.

As explained above, any real signal includes two complex signals having symmetric frequencies to the positive and negative sides when seeing it as a complex signal. These vectors rotate inversely to each other over time and the imaginary part is always cancelled out, so that a real signal as a sum of the both does not have an imaginary part.

The phase-locked circuit shown in FIG. 1 handles an input signal as a complex signal and obtains an output signal, wherein the phase is locked to either one of a positive frequency component or a negative frequency component of the complex signal.

The phase-locked circuit shown in FIG. 1 has a complex signal processor 100 and a feedback portion 200.

The complex signal processor 100 has multipliers 101 and 102, an adder 103 and a complex signal generation portion 104.

The complex signal processor 100 is an embodiment of a complex signal processor of the present invention.

The feedback portion 200 is an embodiment of a feedback portion of the present invention.

The complex signal generation portion 104 is an embodiment of a complex signal generation portion of the present invention.

The multiplier 101 is an embodiment of a first calculation portion of the present invention.

The multiplier 102 is an embodiment of a second calculation portion of the present invention.

The adder 103 is an embodiment of a third calculation portion of the present invention.

In the present specification, a complex signal and an actual signal are distinguished by adding an underline "_" to a complex signal.

[Complex Signal Processor 100]

The complex signal processor 100 generates a signal Vpd in accordance with a declination of a complex signal obtained by multiplying a first complex signal _Vin (the real part: $Vin_I$, the imaginary part: $Vin_Q$) and a later explained second complex signal _Vlo based on a feedback control signal Vc and the first complex signal _Vin (the real part: $Vin_I$, the imaginary part: $Vin_Q$).

The second complex signal _Vlo includes a first signal component $Vlo_Q$ as the imaginary part and a second signal component $Vlo_I$ as the real part component. Phases of the signal components are perpendicular to each other, and the frequencies are in accordance with the feedback control signal Vc. Also, the frequencies are set to have a predetermined polarity, which is constant regardless of the feedback control signal Vc. It is assumed that the frequencies are set to have a negative polarity as an example below.

It is assumed that the first complex signal _Vin has a positive angle frequency ω and the second complex signal _Vlo has a negative angle frequency –ω, and they are expressed as formulas below, respectively.

$$\underline{Vin} = Vin_I + jVin_Q = Va \cdot e^{j\omega t} \quad (4)$$

$$\underline{Vlo} = Vlo_I + jVlo_Q = e^{-j(\omega t + \theta)} \quad (5)$$

In the formula (4), "Va" indicates an amplitude of the first complex signal _Vin. Also, "θ" indicates a phase difference of the first complex signal _Vin and the second complex signal _Vlo.

When multiplying the first complex signal _Vin with the second complex signal _Vlo in the multipliers 101 and 102, the formula below is derived.

$$\underline{Vin} \cdot \underline{Vlo} = Va \cdot e^{j\omega t} \cdot e^{-j(\omega t + \theta)} = Va \cdot e^{-j\theta} \quad (6)$$

When separating the formula (6) to a real part and an imaginary part, the next formula is derived.

$$\underline{Vin} \cdot \underline{Vlo} = Va \cdot e^{j\omega t} \cdot e^{-(j\omega t + \theta)} \quad (7)$$

$$= Va\{\cos\omega t + j \cdot \sin\omega t\}\{\cos(\omega t + \theta) - j \cdot \sin(\omega t + \theta)\}$$

$$= Va\{\cos\omega t \cdot \cos(\omega t + \theta) + \sin\omega t \cdot \sin(\omega t + \theta)\} +$$

$$j \cdot Va\{-\cos\omega t \cdot \sin(\omega t + \theta) + \sin\omega t \cdot \cos(\omega t + \theta)\}$$

When assuming that the complex signal processor 100 outputs an imaginary part of the formula (7) as a signal Vpd, the signal Vpd is expressed as the formula below.

$$Vpd = Va\{-\cos\omega t \cdot \sin(\omega t + \theta) + \sin\omega t \cdot \cos(\omega t + \theta)\} = -Va \cdot \sin\theta \quad (8)$$

According to the formula (8), the signal Vpd can be calculated by using two multiplying circuits and one adding circuit.

The multiplier 101 multiplies a first signal component $Vlo_Q$ of the second complex signal _Vlo with a real part component $Vin_I$ of the first complex signal Vin. Namely, the formula (8) below is calculated.

$$Vin_I \times Vlo_Q = -Va \times \cos\omega t \times \sin(\omega t + \theta)$$

The multiplier 102 multiplies the second signal component $Vlo_I$ of the second complex signal _Vlo with an imaginary part component $Vin_Q$ of the first complex signal _Vin. Namely, the formula (8) below is calculated.

$$Vin_Q \times Vlo_I = -Va \times \sin\omega t \times \cos(\omega t + \theta)$$

The adder 103 calculates a sum of multiplication results of the multiplier 101 and the multiplier 102. As a result, the signal Vpd in the formula (8) is obtained.

The complex signal generation portion 104 generates a first signal component $Vlo_Q$ and a second signal component $Vlo_I$ having a frequency ω in accordance with the feedback control signal Vpd and phases of which are apart by ¼ cycle (π/2) (that is, both phases have a quadrature relationship).

Also, the complex signal generation portion 104 sets a phase relationship of the first signal component $Vlo_Q$ and the second signal component $Vlo_I$, so that a polarity of a frequency of the second complex signal _Vlo always becomes negative.

Note that, as illustrated in FIG. 6 as a circuit example explained next, when realizing the complex signal generation portion 104 by a circuit, it is normally not necessary to provide a special configuration for maintaining the phase relationship constant, because a circuit has to be added when changing the phase relationship of the two signal components $Vlo_I$ and $Vlo_Q$.

FIG. 6 is a view of an example of the configuration of the complex signal generation portion 104.

The complex signal generation portion 104 has D-type flip-flops 106 and 107, an inverter 108 and a signal generation portion 105.

The flip-flops 106 and 107 are cascade connected, and an output signal of the final stage of the cascade connection (the flip-clop 107 in the example in FIG. 6) is logically inverted by the inverter 108 and input to the initial stage of the cascade connection (the flip-flop 106 in the example in FIG. 6). An output signal of the flip-flop 106 is output as a second signal component $Vlo_I$ and an output signal of the flip-flop 107 is output as a first signal component $Vlo_Q$.

The signal generation portion 105 is, for example, a voltage controlled oscillator (VCO) and generates a signal S105 having a frequency in accordance with an amplitude of a feedback control signal Vc. The flip-flops 106 and 107 latch an input signal in synchronization with the signal S105.

FIG. 7A to FIG. 7C show signal waveforms of respective portions in the complex signal generation portion 104 shown as an example in FIG. 6.

An output signal of the inverter 108 is delayed by an amount of two cycles of the signal S105 by the flip-flops 106 and 107 and fed back to an input of the inverter 108. Therefore, positive and negative of the output signal of the inverter 108 is inverted for every two cycles of the signal S105, and the cycle becomes 4 times the cycle of the signal S105.

Accordingly, the first signal component $Vlo_Q$ and the second signal component $Vlo_I$ have 4 times the cycle of the signal S105 (that is, a frequency of ¼).

Also, the first signal component $Vlo_Q$ has a delay of an amount of one stage of a flip-flop, that is, a delay of ¼ cycle with respect to the second signal component $Vlo_I$.

In the example in FIG. 6, a delay circuit is configured by two-stage flip-flops, but the number of stages may be increased to an even number larger than two (four stages, six stages, . . . ). In this case, two signals having a delay difference corresponding to a half of the total number of stages has a delay difference of ¼ of one cycle, so that they can be used as the first signal component $Vlo_Q$ and second signal component $Vlo_I$.

[Feedback Portion 200]

The feedback portion 200 generates a feedback control signal Vc for operating feedback control in accordance with the signal Vpd generated in the complex signal processor 100, so that the signal Vpd converges to a constant value.

Figure 8:
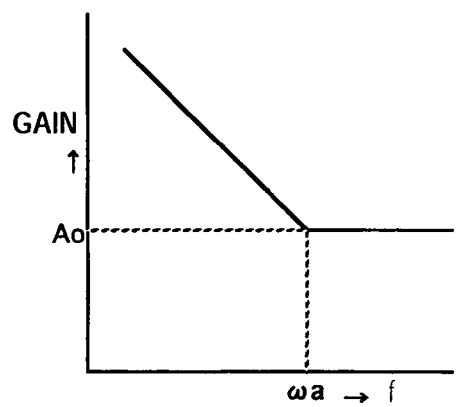
FIG. 8 is a view showing an example of frequency characteristics of a feedback portion.

The feedback portion 200 is configured as a filter circuit for amplifying, for example, a direct-current component of the signal Vpd generated by the complex signal processor 100 by a predetermined transfer function. The transfer function H(s) has a frequency characteristic, for example as shown in FIG. 8, and is expressed by the next formula.

$$H_{(s)} = Ao \cdot (1 + \omega a/s) \quad (9)$$

A direct-current gain of the transfer function H(s) is infinite, so that the output signal of the complex signal processor 100 has to be zero in a stationary state. Accordingly, from the formula (8), a frequency of the second complex signal _Vlo is controlled, so that the phase difference θ becomes zero. As a result, when a frequency of the first complex signal _Vin changes, the frequency of the second complex signal _Vlo follows thereto and changes.

In the formula (4), the first complex signal _Vin is assumed to have a positive frequency, but when it has the same negative frequency as that of the second complex signal _Vlo, the first complex signal _Vin becomes as the formula below.

$$\underline{Vin} = Vin_I + jVin_Q = Va \cdot e^{-j\omega t} \quad (10)$$

When multiplying the first complex signal _Vin with the second complex signal _Vlo, the multiplication result becomes as below.

$$\underline{Vin} \cdot \underline{Vlo} = Va \cdot e^{-j\omega t} \cdot e^{-j(\omega t + \theta)} = Va \cdot e^{-j(2\omega t + \theta)} \quad (11)$$

In this case, since both of the complex signals have a negative frequency, even when they are multiplied, only a signal having a high frequency, such as an angle frequency of 2ω, is generated and a signal having a phase difference of θ is not generated. Therefore, a phase of the second complex signal _Vlo is not locked to the first complex signal _Vin.

According to the above explained configuration, the second complex signal _Vlo has a frequency in accordance with the feedback control signal Vc, and the frequency has a negative polarity. The signal Vpd in accordance with a declination of a complex signal obtained by multiplying the second complex signal _Vlo with the first complex signal _Vin is generated in the complex signal processor 100.

The declination of the complex signal obtained by multiplying the second complex signal _Vlo with the first complex signal _Vin is equal to a declination obtained by adding a declination of the first complex signal _Vin and a declination of the second complex signal _Vlo. Therefore, a signal Vpd in accordance with the added declination is generated in the complex signal processor 100.

In the feedback portion 200, in accordance with the signal Vpd, a feedback control signal Vc for operating a feedback control is generated, so that the above added declination converges to a constant value (for example, zero).

A declination becoming constant is equivalent to a declination being constant over time and a frequency becoming zero. Accordingly, it is necessary that the first complex signal _Vin and the second complex signal _Vlo have frequencies having the same size and opposite polarities to converge the above added declination to a constant value.

Therefore, the frequency of the second complex signal _Vlo is controlled, so that the negative frequency of the second complex signal _Vlo cancels out the positive frequency of the first complex signal _Vin.

Inversely, when both of the second complex signal _Vlo and the first complex signal _Vin have negative frequencies, the above added declination always has a frequency and it cannot be converged to a constant value. Therefore, in this case, the feedback control does not operate and the frequency of the second complex signal _Vlo does not follow the frequency of the first complex signal _Vin.

Accordingly, a phase of the second complex signal _Vlo is locked only to the first complex signal _Vin having a positive frequency.

As explained above, according to the phase-locked circuit according to the present embodiment, a phase of the second complex signal _Vlo can be locked only to a component of a positive frequency among components having positive and negative frequencies included in an input first complex signal _Vin. Consequently, positive and negative frequency components can be distinguished for handling and the mutual interference can be fundamentally prevented.

Second Embodiment

Next, a second embodiment of the present invention will be explained.

In the phase-locked circuit according to the first embodiment, a circuit using a flip-flop shown in FIG. 6 was described as an example of the complex signal generation portion 104.

Since both of signals $Vlo_I$ and $Vlo_Q$ generated in this circuit are pulses, so that the odd-order harmonics, such as a third-order and fifth-order, are included. Such harmonics may become unfavorable depending on an object for applying the present circuit. In the second embodiment, a phase-locked circuit capable of reducing an effect of harmonics as such will be explained.

Figure 9:
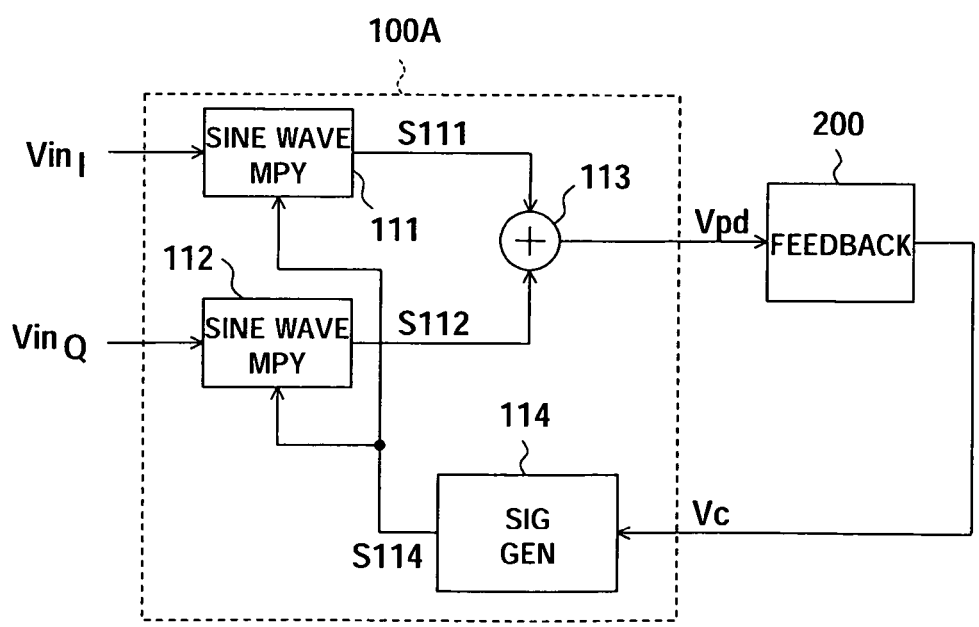
FIG. 9 is a view of an example of the configuration of a phase-locked circuit according to a second embodiment.

FIG. 9 is a view of an example of the configuration of a phase-locked circuit according to the second embodiment of the present invention.

The phase-locked circuit shown in FIG. 9 includes a complex signal processor 100A and a feedback portion 200.

The complex signal processor 100A has first and second sine wave multipliers 111 and 112, an adder 113 and a signal generation portion 114.

The signal generation portion 114 is an embodiment of a signal generation portion of the present invention.

The sine wave multiplier 111 is an embodiment of a fourth calculation portion of the present invention.

The sine wave multiplier 112 is an embodiment of a fifth calculation portion of the present invention.

The adder 113 is an embodiment of a sixth calculation portion of the present invention.

A complex signal processor 110A having a different configuration from that of the phase-locked circuit shown in FIG. 1 will be explained.

[Complex Signal Processor 100A]

Overall processing of the complex signal processor 100A is the same as the complex signal processor 100 explained above.

The complex signal processor 100A generates a signal Vpd in accordance with a declination of a complex signal obtained by multiplying a first complex signal_Vin with a second complex signal _Vlo based on a feedback control signal Vc and the first complex signal _Vin.

The second complex signal _Vlo has a frequency in accordance with the feedback control signal Vc and mutually perpendicular components $Vlo_Q$ and $Vlo_I$, wherein the frequency is set to be negative.

The signal generation portion 114 is, for example, a VCO and generates a clock signal S114 having a frequency in accordance with the feedback control signal Vc.

The adder 113 adds multiplication results S111 and S112 of later explained sine wave multipliers 111 and 112 and generates a signal Vpd.

The first sine wave multiplayer 111 selects for each cycle of the clock signal S114 a coefficient value in accordance with an instantaneous value for the first signal component $Vlo_Q$ to have in the cycle from a predetermined plurality of coefficient values, and multiplies the selected coefficient value with a real part component $Vin_I$ of the first complex signal _Vin.

The second sine wave multiplier 112 selects for each cycle of the clock signal S114 a coefficient value in accordance with an instantaneous value for the second signal component $Vlo_I$ to have in the cycle from a predetermined plurality of coefficient values, and multiplies the selected coefficient value with an imaginary part component of the first complex signal _Vin.

Figure 10:
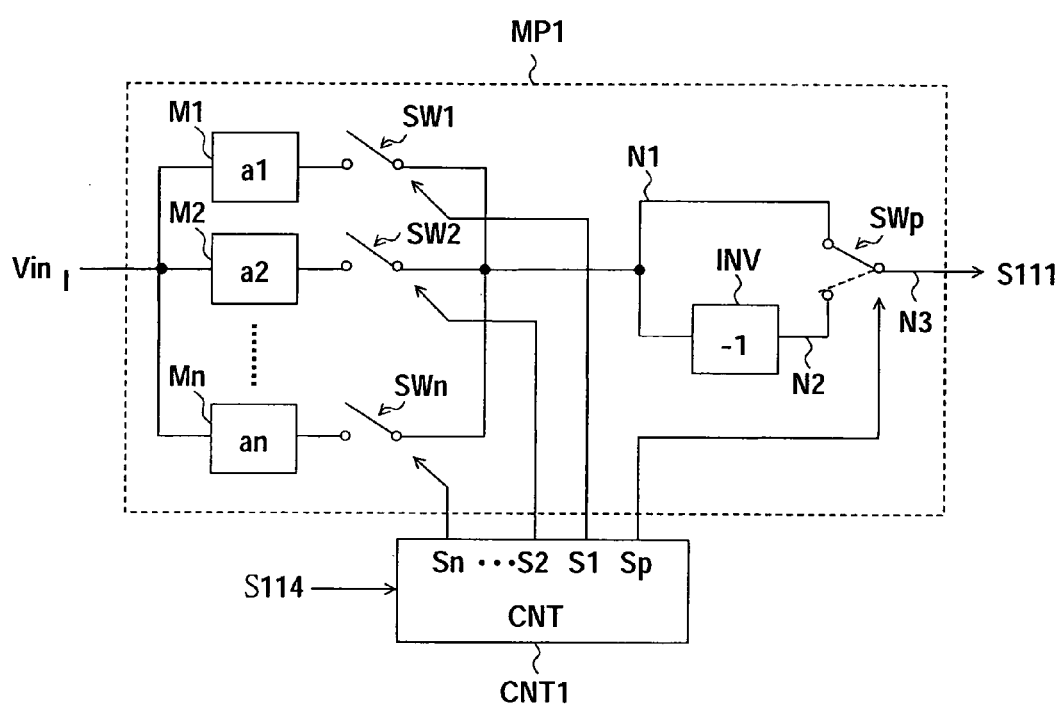
FIG. 10 is a view of an example of the configuration of a sine wave multiplier.

FIG. 10 is a view of an example of the configuration of the first sine wave multiplier 111.

The sine wave multiplier 111 has a multiplying portion MP1 and a control portion CNT1. The multiplying portion MP1 includes n number of coefficient multiplying circuits M1 to Mn, n number of coefficient selection switches SW1 to SWn, a polarity selection switch SWp and a polarity inversion circuit INV.

The coefficient multiplying circuits M1 to Mn multiply a real part component $Vin_I$ to be input with coefficients "a1" to "an".

One ends of the coefficient selection switches SW1 to SWn are connected respectively to outputs of the coefficient multiplying circuits M1 to Mn, and the other ends thereof are connected to a node N1.

The polarity inversion circuit INV inverts multiplication results of the coefficient multiplying circuits M1 to Mn output to the node N1.

The polarity selection switch SWp selects either one of the node N1 connected to the coefficient selection switches SW1 to SWn or a node N2 connected to an output of the polarity inversion circuit INV, and connects the same to an output node N3. The multiplication result Sill of the sine wave multiplier 111 is output from the output node N3.

The control portion CNT1 controls the coefficient selection switches SW1 to SWn, so that for each cycle of the clock signal S114 a multiplying circuit having a coefficient, whose absolute value is equal to that of an instantaneous value for the first signal component $Vlo_Q$ to have in a predetermined phase (for example, 0°) in one cycle, is selected. Also, the polarity selection switch SWp is controlled in accordance with a polarity of the first signal component VloQ in the predetermined phase.

FIG. 10 is a configuration example of the first sine wave multiplier 111, but the second sine wave multiplier 112 can be also configured in the same way.

It is preferable that one cycle of the first signal component $Vlo_Q$ and the second signal component $Vlo_I$ is proportional to one cycle of the clock signal S114 by multiples of four. Consequently, while keeping a phase difference of the first signal component $Vlo_Q$ and the second signal component $Vlo_I$ to ¼ cycle, multiplying circuits having the same coefficient values can be used in the sine wave multipliers 111 and 112.

For example, when configuring the multiplying portion MP1 by using two coefficient multiplying circuits M1 and M2, the coefficient selection switches SW1 and SW2 and the polarity selection switch SWp are controlled as shown in FIG. 11A to FIG. 11D. In this case, a waveform m0(t) indicating time-series changes of a coefficient value becomes a waveform obtained by sampling signal components ($Vlo_Q$ and $Vlo_I$) in a sine wave shape as shown in FIG. 12. As explained above, a coefficient value of a multiplying circuit is selected so as to be equal to a sampling value of the signal components ($Vlo_Q$ and $Vlo_I$) at a sampling point synchronized with the clock signal S114.

Figure 13:
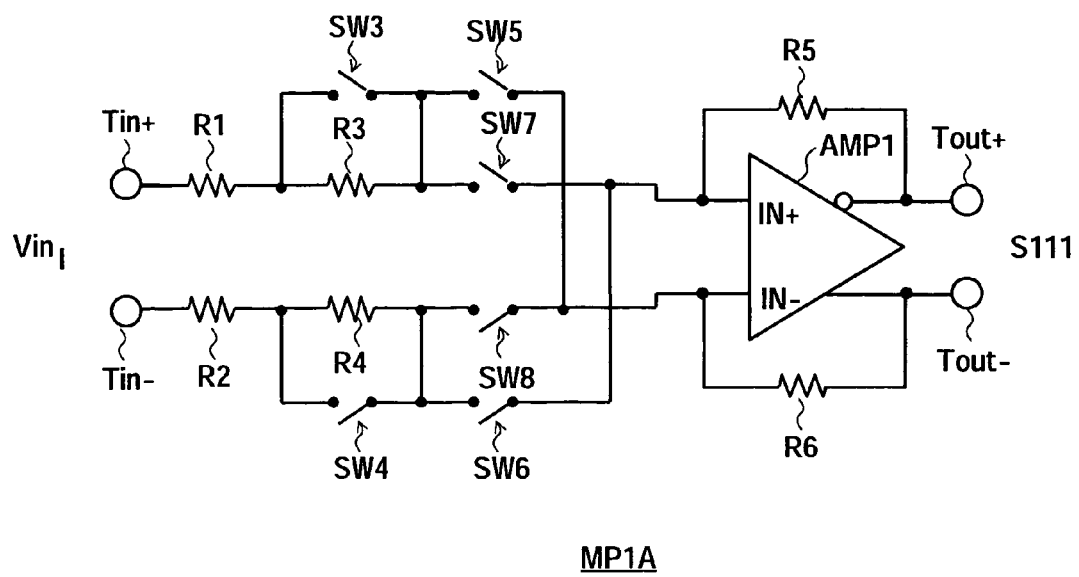
FIG. 13 is a view of a configuration example of a multiplier in the case where there are two multiplier coefficients.

When there are two multiplying coefficients, the multiplying portion can be configured to be very simple as shown in FIG. 13.

FIG. 13 is a view of a configuration example of a multiplying portion MP1A when there are two multiplying coefficients.

The multiplying portion MP1A has resistors R1 to R6, coefficient selection switches SW3 and SW4, polarity selection switches SW5 to SW8 and a differential amplification circuit AMP1.

Between input terminals Tin+ and Tin−, a real part component $Vin_I$ of the first complex signal _Vin is input as a differential signal.

The input terminal Tin+ is connected respectively to one terminals of the polarity selection switches SW5 an SW7 via a series circuit of the resistors R1 and R3. The other terminal of the polarity selection switch SW5 is connected to a negative-side input terminal IN− of the differential amplification circuit AMP1, and the other terminal of the polarity selection switch SW7 is connected to a positive-side input terminal IN+ of the differential amplification circuit AMP1.

The input terminal Tin− is connected respectively to one terminals of the polarity selection switches SW6 an SW8 via a series circuit of the resistors R2 and R4. The other terminal of the polarity selection switch SW6 is connected to a positive-side input terminal IN+ of the differential amplification circuit AMP1, and the other terminal of the polarity selection switch SW8 is connected to a negative-side input terminal IN− of the differential amplification circuit AMP1.

The coefficient selection switch SW3 is connected in parallel with the resistor R3, and the coefficient selection switch SW4 is connected in parallel to the resistor R4.

The positive-side output terminal of the differential amplification circuit AMP1 is connected to an output terminal Tout+ and to a positive-side input terminal IN+ via the resistor R5.

The negative-side output terminal of the differential amplification circuit AMP1 is connected to an output terminal Tout− and to a negative-side input terminal IN− via the resistor R6.

Resistance values of the resistors R1 to R6 are set, for example, as below.

Resistors R1 and R2: 42.29 kΩ
Resistors R3 and R4: 62.15 kΩ
Resistors R5 and R6: 40 kΩ

According to the multiplying portion MP1A shown in FIG. 13, when turning on the coefficient selection switches SW3 and SW4, a coefficient value a1=R5/R1. Also, when turning off the coefficient selection switches SW3 and SW4, a coefficient value of a2=R5/(R1+R3) stands.

When turning off the polarity selection switches SW7 and SW8 and turning on the polarity selection switches SW5 and SW6, a polarity of a multiplying coefficient of the multiplying portion MP1A is set to be positive. Namely, the output signal S111 has the same polarity as that of the real part signal VinI.

Inversely, when turning on the polarity selection switches SW7 and SW8 and turning off the polarity selection switches SW5 and SW6, a polarity of a multiplying coefficient of the multiplying portion MP1A is set to be negative. Namely, the output signal S111 has a different polarity from that of the real part signal VinI.

From the above operation, control of the switches S3 to S8 are performed, for example, as shown in FIG. 14A to FIG. 14D.

Figure 15:
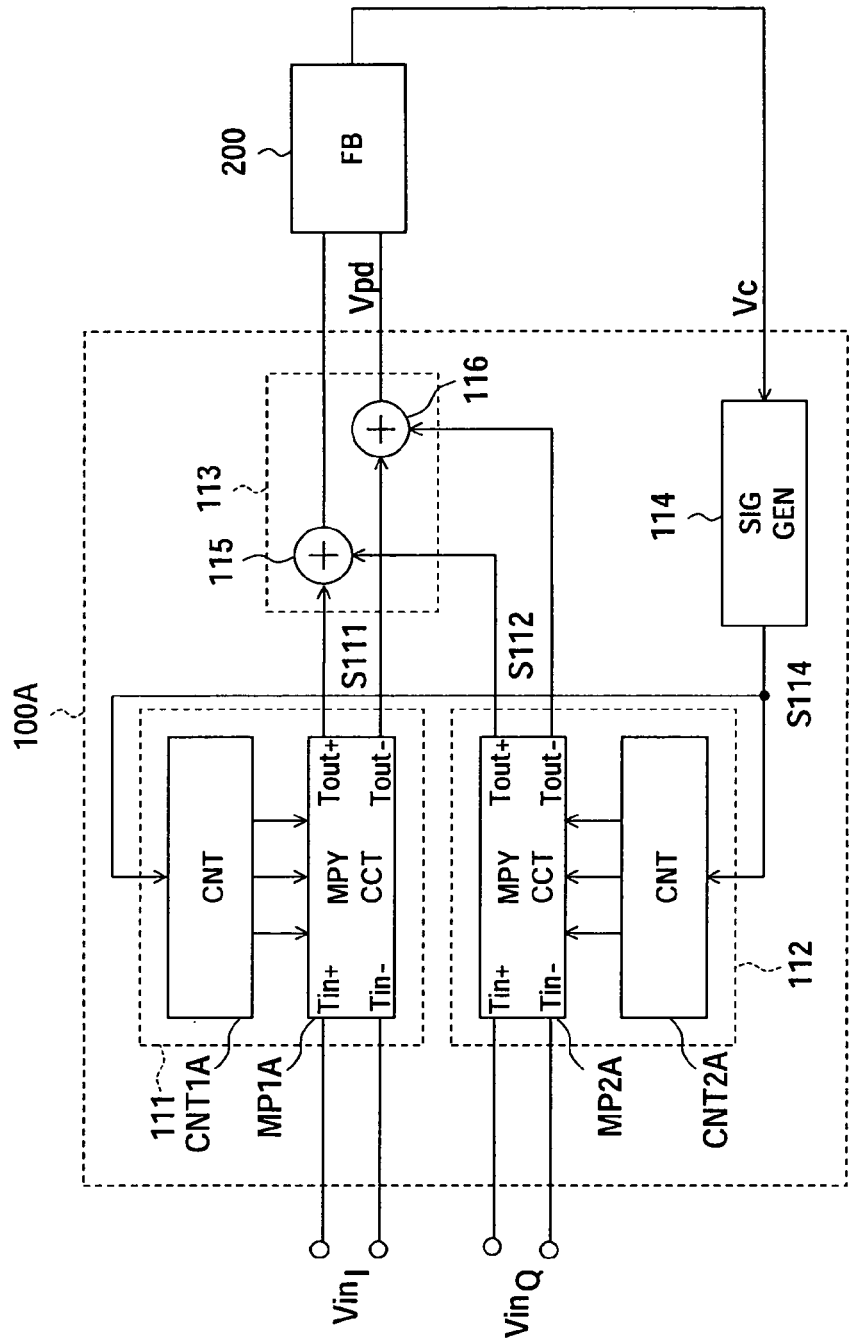
FIG. 15 is a view of a configuration example of a phase-locked circuit when using a multiplier in a complex signal processor.

FIG. 15 is a configuration example of a phase lock circuit when using the multiplying portion shown in FIG. 13 in the complex signal processor 100A. In FIG. 9, FIG. 13 and FIG. 15, the same reference numbers indicate the same components.

In the example in FIG. 15, the sine wave multiplier 111 has a multiplying portion MP1A and the control portion CNT1A, and the sine wave multiplier 112 has a multiplying portion MP2A and the control portion CNT2A.

The multiplying portion MP2A has the same configuration as that of the multiplying portion MP1A shown in FIG. 13.

Figure 14:
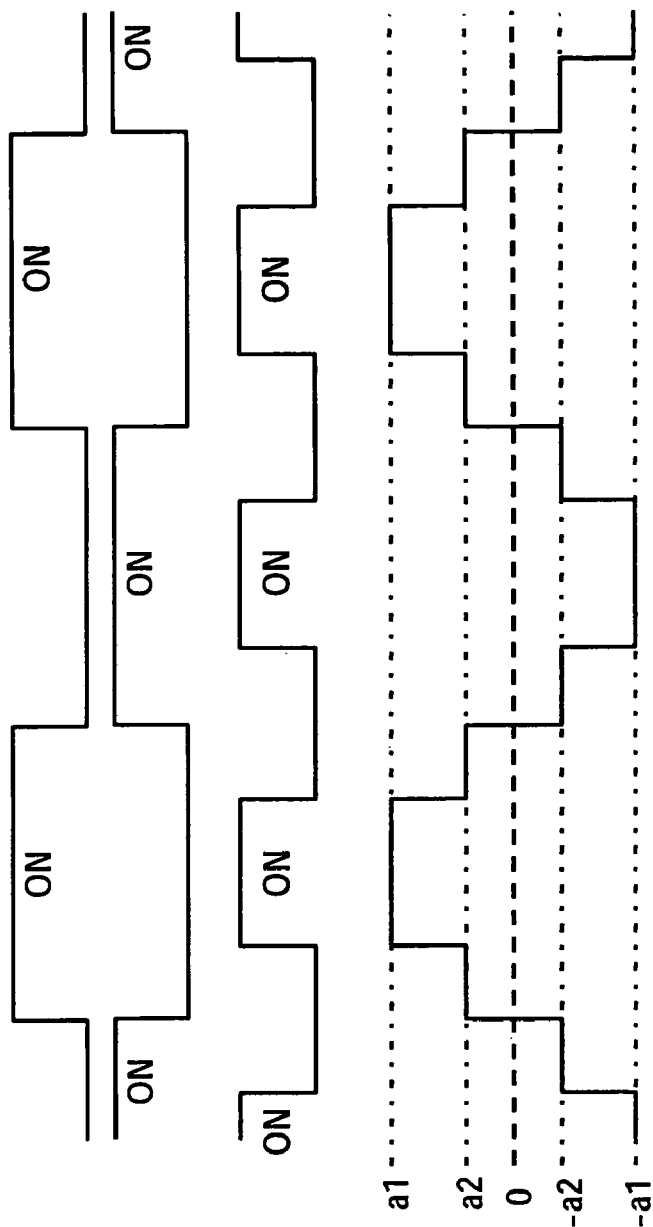
FIG. 14A to FIG. 14D are views of a control example of respective switches of the multiplier shown in FIG. 13.

The control portions CNT1A and CNT2A control switches, for example, as shown in FIG. 14 to realize multiplication of an input real part signal $Vin_I$ with a first signal component $Vlo_Q$ or multiplication of an input imaginary part signal $Vin_Q$ with the second signal component $Vlo_I$.

In the example in FIG. 15, the adder 113 has two adding circuits 115 and 116 and adds a differential output signal S111 of the multiplying portion MP1A and a differential output signal S112 of the multiplying portion MP2A. Namely, the adding circuit 115 adds positive-side output signals of the multiplying portions MP1A and MP2A and outputs as a positive-side signal of the signal Vpd. The adding circuit 116 adds negative-side output signals of the multiplying portions MP1A and MP2A and outputs as a negative-side signal of the signal Vpd.

Figure 16:
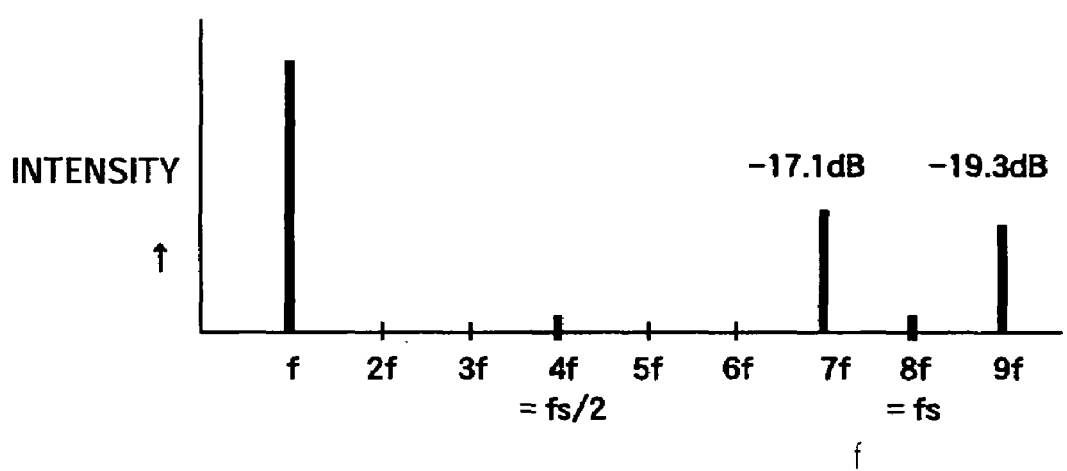
FIG. 16 is a view of an example of a frequency spectrum of an output signal of the sine wave multiplier in the phase-locked circuit shown in FIG. 15.

FIG. 16 is a view of an example of a frequency spectrum of the output signals S111 and S112 of the sine wave multipliers 111 and 112 in the phase-locked circuit shown in FIG. 15.

As is known from FIG. 16, the output signals S111 and S112 do not include the third and fifth harmonics, and the lowest is the seventh harmonics. Normally, the seventh harmonics can be easily removed by a filter, so that they do not cause any problems in almost all applications.

Also, when the number of multiplying coefficients is furthermore increased, harmonics of higher orders can be removed. For example, when using four multiplying coefficients, the fifteenth-order harmonics are the lowest.

As explained above, according to the phase-locked circuit according to the present embodiment, a harmonic component can be widely attenuated comparing with the case of multiplying a complex signal having a rectangular-shaped waveform as shown in FIG. 6 with an input complex signal.

Generally, an analog multiplying circuit typified by a Gilbert multiplying circuit is susceptible to an effect of a direct-current offset, and there is a disadvantage that the multiplication is not accurate. When multiplying a rectangular-shaped signal generated by the circuit shown in FIG. 6 with an input signal, it can be realized only by switching, so that an effect by an offset is eliminated and the accuracy can be drastically improved, while there is a disadvantage that an effect of the odd-order harmonic component cannot be prevented.

On the other hand, when using a circuit of the second embodiment, wherein a coefficient is switched and multiplied with an input signal, an offset and multiplication accuracy can be drastically improved and an effect by harmonics can be also effectively prevented.

Therefore, more accurate phase synchronization can be realized, and a phase-locked circuit suitable to a use application requiring sharp and absolute accuracy, such as later explained signal processing of a resolver angle sensor, can be provided.

The embodiments explained above do not have a generation circuit of an output signal corresponding to the second complex signal _Vlo shown in FIG. 1, but this signal can be easily generated, for example, based on a clock signal of the signal generation portion 114.

For example, by providing a circuit having the same configuration as that of the sine wave multiplier shown in FIG. 10 and FIG. 13 and fixing the input signal to a constant value, a pseudo sine wave may be generated. Alternately, by providing a circuit for performing frequency dividing on the signal S114 of the signal generation portion 114, a pulse output signal may be generated.

Third Embodiment

Next, a third embodiment of the present invention will be explained.

The third embodiment is an example of applying the above first or second phase-locked circuit to frequency conversion processing.

Figure 17:
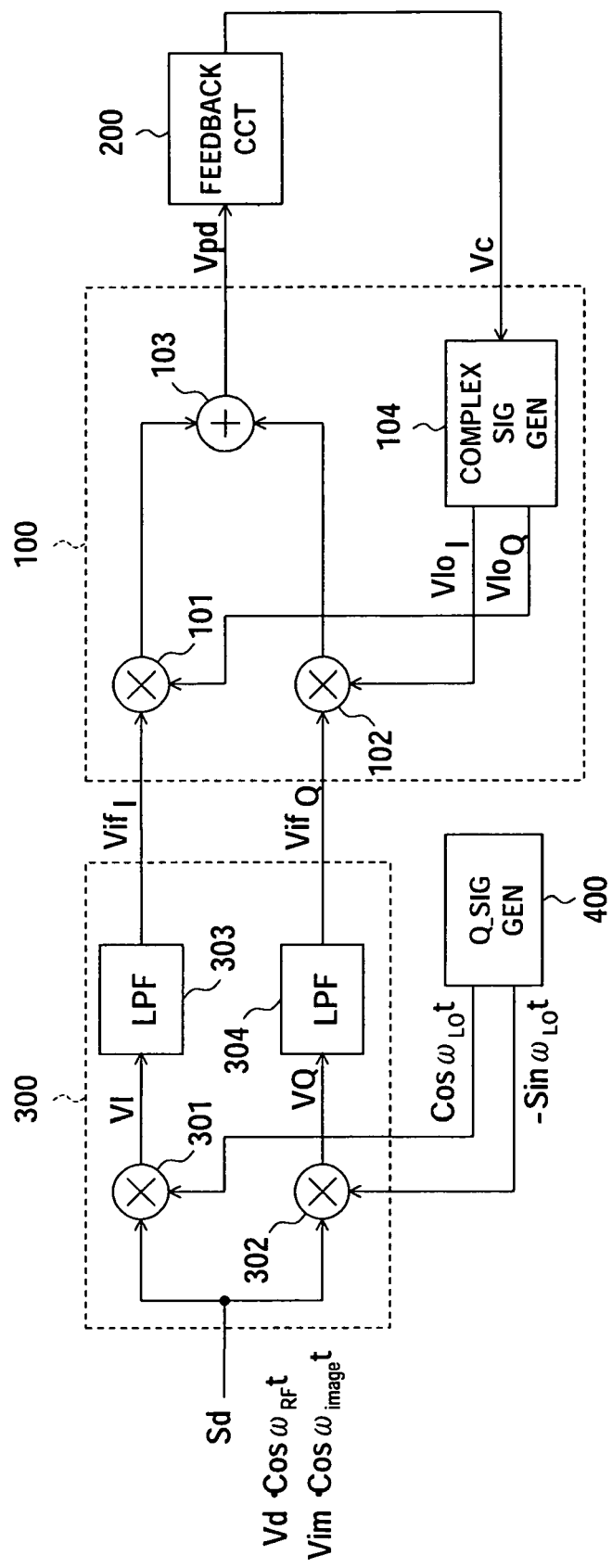
FIG. 17 is a view of an example of the configuration of a phase-locked circuit according to a third embodiment.

FIG. 17 is a view of an example of the configuration of a phase-locked circuit according to the third embodiment of the present invention.

For example, a radio communication apparatus performs processing of receiving as an input an FM (frequency) modulated signal, converting the same to an intermediate frequency (IF) and taking out the modulated signal by a phase-locked loop.

When using a signal, wherein a frequency $\omega_{RF}$ is a center frequency, as a desired signal and mixing therein a local oscillation signal having a lower frequency $\omega_{LO}$ exactly by an IF $\omega_{IF}$, an IF signal, wherein the IF $\omega_{IF}$ is the center, can be obtained.

This is expressed by the formula below.

$$\mathrm{Cos}\omega_{RF}t \cdot \mathrm{Cos}\omega_{LO}t = \frac{1}{2}\{\mathrm{Cos}(\omega_{RF}-\omega_{LO})t + \mathrm{Cos}(\omega_{RF}+\omega_{LO})t\} \quad (12)$$

The first term in the formula (12) includes an IF $\omega_{IF}(=\omega_{RF}-\omega_{LO})$, which becomes an IF signal.

Figure 34:
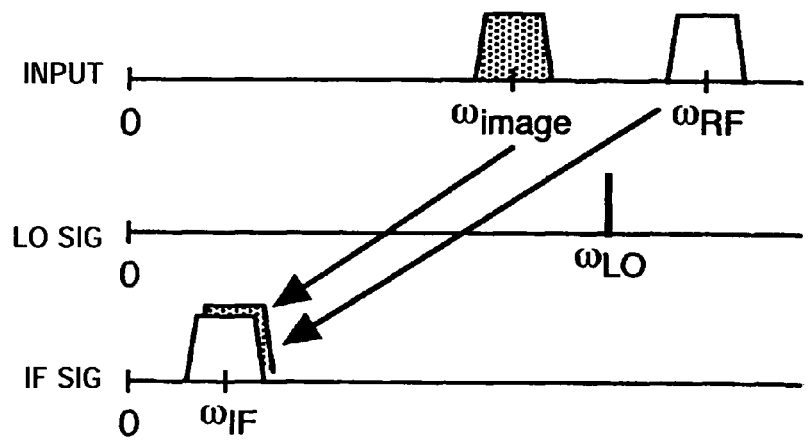
FIG. 34 is a view for explaining an image signal in frequency conversion processing.

However, when mixing the input signal and the local oscillation signal, not only a signal having a frequency $\omega_{RF}$ is converted to have the frequency $\omega_{IF}$ but, as shown in FIG. 34, a signal having a frequency $\omega_{image}$ being away from the frequency $\omega_{LO}$ exactly by an amount of the frequency $\omega_{IF}$ to the negative side is also converted to have an IF $\omega_{IF}$.

$$\mathrm{Cos}\omega_{image}t \cdot \mathrm{Cos}\omega_{LO}t = \frac{1}{2}\{\mathrm{Cos}(\omega_{LO}-\omega_{image})t + \mathrm{Cos}(\omega_{LO}+\omega_{image})t\} \quad (13)$$

The first term in the formula (13) includes an IF $\omega_{IF}$ $(=\omega_{LO}-\omega_{image})$, and the mixed signal is overlapped with an IF signal.

Accordingly, when a signal exists at the frequency $\omega_{image}$, an unnecessary signal other than the desired signal is overlapped with the IF signal. This is known as an image problem of the superheterodyne system.

To solve the image problem, a method of performing filter processing by using an image removal filter in advance before frequency conversion so as to remove signals from the frequency $\omega_{image}$ or a method of using an image removal mixer is used.

Figure 18:
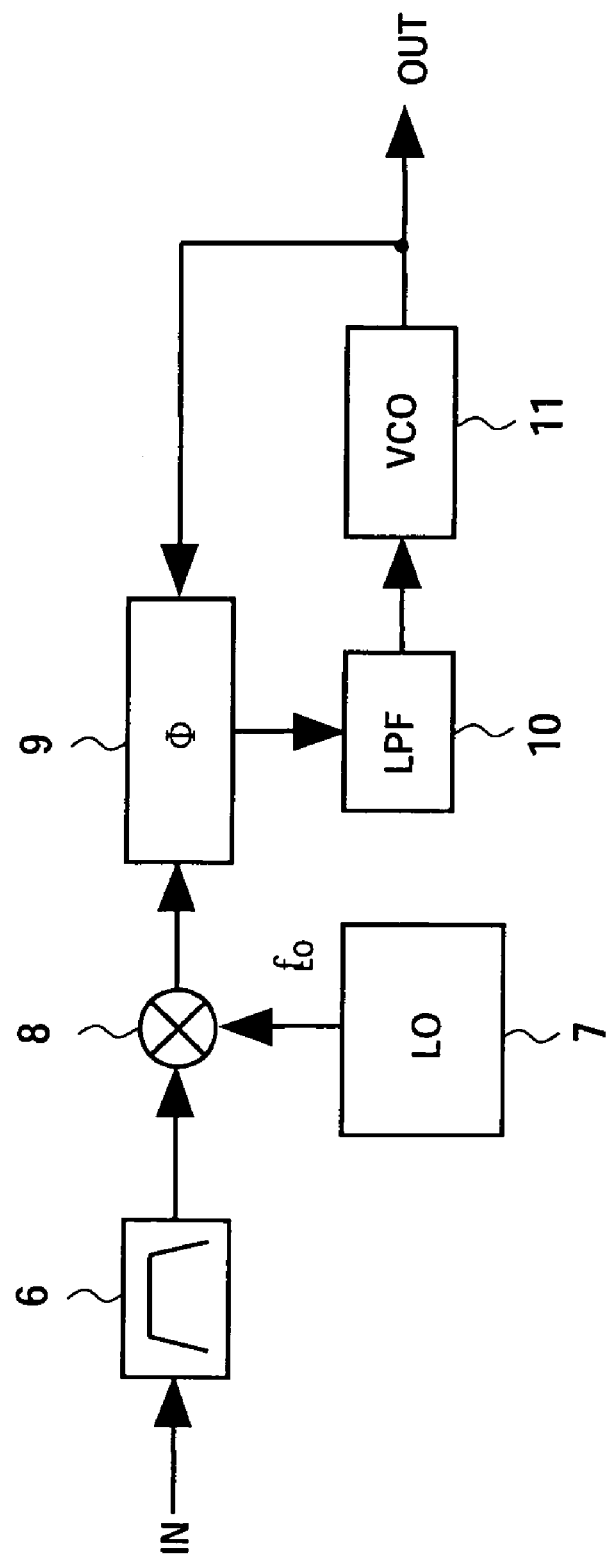
FIG. 18 is a view of an embodiment of the related art using an image removal filter.

FIG. 18 is a view of an example of using an image removal filter 6.

In the circuit shown in FIG. 18, signals in a band to be an image in the input signal are removed in advance by the image removal filter 6. Then, the signal after the image removal and a local oscillation signal of a local oscillator 7 are mixed in a multiplier 8, subjected to frequency conversion, and input to a PLL circuit composed of a phase comparator 9, a LPF 10 and a VCO 11.

Disadvantages of this method are that an image removal filter 6 is necessary, and the IF $\omega_{IF}$ and the frequency $\omega_{image}$ get close as the IF $\omega_{IF}$ becomes lower, so that dividing by the filter 6 becomes difficult.

Figure 19:
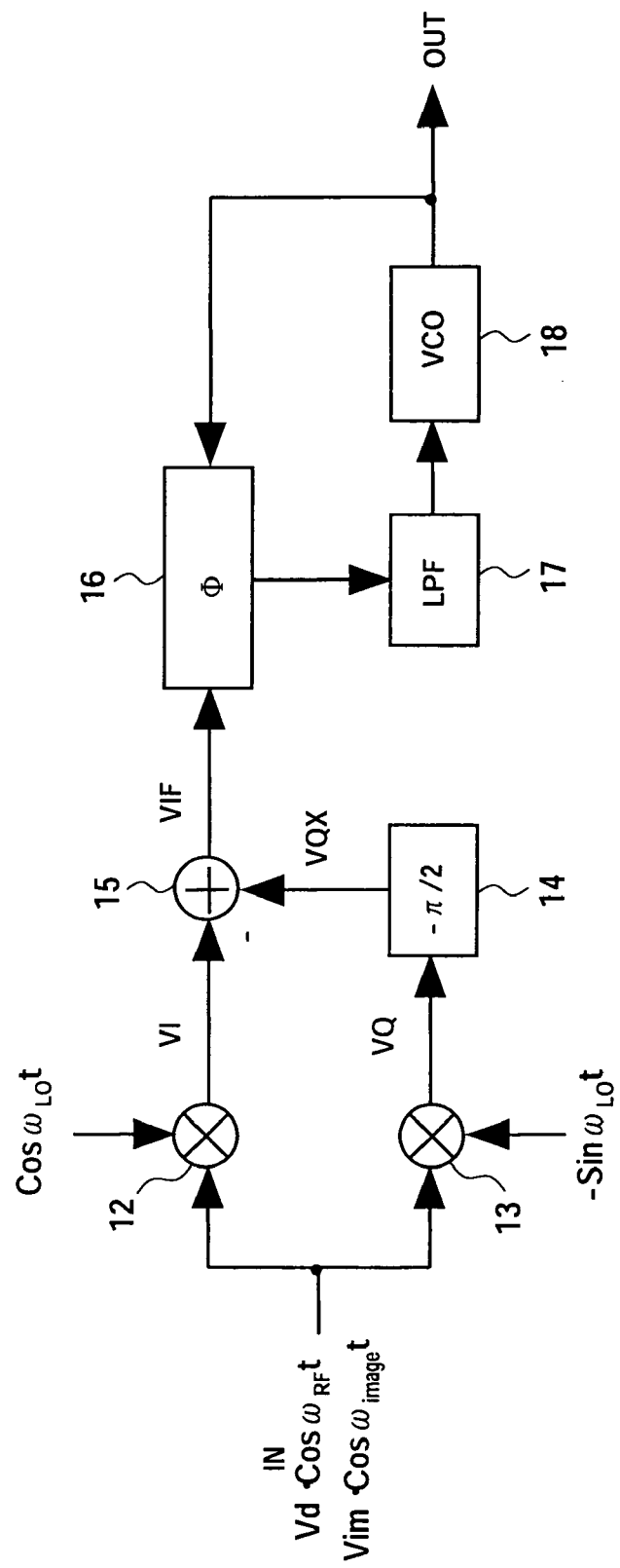
FIG. 19 is a view of an embodiment of the related art using an image removal mixer.

FIG. 19 is a view of an example of using an image removal mixer.

In the circuit shown in FIG. 19, the input signal and a signal $\cos \omega_{LO} t$ are mixed to generate a signal VI by the multiplier 12, and the input signal and a signal $-\sin \omega_{LO} t$ are mixed to generate a signal VQ by the multiplier 13.

The case where a signal having a desired frequency $\omega_{RF}$ is input will be explained. The signals VI and VQ with respect to the desired frequency $\omega_{RF}$ are expressed as formulas below.

$$VI = Vd \cdot \cos\omega_{RF}t \cdot \cos\omega_{LO}t \quad (14)$$
$$= \frac{Vd}{2}\{\cos(\omega_{RF} - \omega_{LO})t + \cos(\omega_{RF} + \omega_{LO})t\}$$
$$= > \frac{Vd}{2}\cos(\omega_{RF} - \omega_{LO})t$$

$$VQ = -Vd \cdot \cos\omega_{RF}t \cdot \sin\omega_{LO}t \quad (15)$$
$$= -\frac{Vd}{2}\{-\sin(\omega_{RF} - \omega_{LO})t + \sin(\omega_{RF} + \omega_{LO})t\}$$
$$= > \frac{Vd}{2}\sin(\omega_{RF} - \omega_{LO})t$$

The final terms in the formulas (14) and (15) indicate only an IF band component focused here.

The signal VQ is converted to a signal VQX delayed exactly by a phase angle of $\pi/2$ by a phase-shift circuit 14.

The signal VQX is expressed as the formula below.

$$VQX \approx -\frac{Vd}{2}\cos(\omega_{RF} - \omega_{LO})t \quad (16)$$

The signal VQ and the signal VQX are subtracted by the adder 15 and a signal VIF is obtained.

$$VIF = VI - VQX = Vd \cdot \cos(\omega_{RF} - \omega_{LO})t \quad (17)$$

The signal VIF becomes equal to a signal obtained by doubling the signal shown in the formula (14), and a desired IF signal is obtained.

An operation of the image removal mixer on the frequency $\omega_{image}$ being away from the frequency $\omega_{LO}$ exactly by the IF $\omega_{IF}$ will be explained. The signals VI and VQ with respect to the frequency $\omega_{image}$ are expressed as formulas below.

$$VI = Vim \cdot \cos\omega_{image}t \cdot \cos\omega_{LO}t \quad (18)$$
$$= \frac{Vim}{2}\{\cos(\omega_{LO} - \omega_{image})t + \cos(\omega_{LO} + \omega_{image})t\}$$
$$= > \frac{Vim}{2}\cos(\omega_{LO} - \omega_{image})t$$

$$VQ = -Vim \cdot \cos\omega_{image}t \cdot \sin\omega_{LO}t \quad (19)$$
$$= -\frac{Vim}{2}\{\sin(\omega_{LO} - \omega_{image})t + \sin(\omega_{LO} + \omega_{image})t\}$$
$$= > -\frac{Vim}{2}\sin(\omega_{LO} - \omega_{image})t$$

A signal VQX obtained by delaying the signal VQ in the formula (19) exactly by a phase angle of $\pi/2$ is expressed as the formula below.

$$VQX \approx \frac{Vim}{2}\cos(\omega_{LO} - \omega_{image})t \quad (20)$$

The signal VQX in the formula (20) has an inversed phase of that of the signal VI in the formula (18), thus, a result of adding the two becomes zero.

$$VIF = VI - VQX = 0 \quad (21)$$

From the above, an image signal having the frequency $\omega_{image}$ can be removed from the IF.

What brings disadvantages in the image removal mixer is a phase-shift circuit. Although it is possible to shift a phase of a certain frequency by $\pi/2$, it is limited to a frequency at one point and it is difficult that the frequency at this one point coincides accurately with the image frequency. Therefore, the phase is not shifted accurately by $\pi/2$ and residual image signals remain.

Also, even when the phase-shift by $\pi/2$ can be accurately realized at a frequency at one point, to maintain it in a broad bandwidth is furthermore difficult. As a means to solve such-disadvantages, for example, a technique called a polyphase filter is known. In this technique, a phase difference of the signals VI and VQ is considered relative, and the phase is delayed in both signals to maintain their phase difference to $\pi/2$ over a broad bandwidth.

However, the polyphase technique also has disadvantages that the circuit becomes complicated, and image canceling cannot be performed well when there is a gain error in signal paths of the signals VI and VQ, furthermore, a disadvantage of a wave distortion due to a delay time and group delay distortion caused by giving a large delay to the signals.

The phase-locked circuit shown in FIG. 17 according to the present embodiment surely cancels an image and locks the phase to a signal having a desired frequency with the very simple configuration without using a phase-shift circuit or a polyphase filter as above.

The phase-locked circuit shown in FIG. 17 has a complex signal processor 100, a feedback portion 200, an intermediate frequency (IF) signal output portion 300 and a quadrature (Q) signal generation portion 400.

Note that the IF signal output portion 300 is an embodiment of a first complex signal output portion of the present invention.

The quadrature signal generation portion 400 is an embodiment of a quadrature signal generation portion of the present invention.

In the phase-locked circuit shown in FIG. 17, the complex signal processing portion 100 and the feedback portion 200 are the same components having the same reference numbers and explained in FIG. 1, so that the explanation will be omitted.

Below, the quadrature signal generation portion 400 and the IF signal output portion 300 will be explained.

[Quadrature Signal Generation Portion 400]

The quadrature signal generation portion 400 has a frequency $-\omega_{LO}$ and generates two quadrature signals $\cos \omega_{LO} t$ and $-\sin \omega_{LO} t$, phases of which intersect to each other at 90°.

The two quadrature signals may be generated, for example, by fixing a frequency of a clock signal S105 to a frequency $4 \times \omega_{LO}$ by the circuit shown in FIG. 6, or by fixing an input signal of the circuit shown in FIG. 10 and FIG. 13 to a constant value.

[IF Signal Output Portion 300]

The IF signal output portion 300 multiplies two quadrature signals $\cos \omega_{LO} t$ and $-\sin \omega_{LO} t$ generated in the quadrature signal generation portion 400 with an input signal Sd, respectively, and performs on two signals VI and VQ as the multiplication results low pass filter processing for attenuating components having a higher frequency than the frequency $\omega_{RF}$ exactly by an amount of a frequency $\omega_{LO}$. Then, a complex signal, wherein a signal $Vif_I$ after the low pass filter processing is a real part component and a signal $Vif_Q$ is an imaginary part component, is output as an IF signal _Vif.

For example, as shown in FIG. 17, the IF signal output portion 300 has multipliers 301 and 302 and low pass filters 303 and 304.

The multipliers 301 and 302 multiply the quadrature signals $\cos \omega_{LO} t$ and $-\sin \omega_{LO} t$ respectively with the input signal.

The low pass filter 303 removes a high frequency component of the output signal VI of the multiplier 301 and outputs the real part signal $Vif_I$.

The low pass filter 304 removes a high frequency component of the output signal VQ of the multiplier 302 and outputs the imaginary part signal $Vif_Q$.

When assuming that the input signal Sd is a complex signal having no imaginary number, the signal VI obtained by multiplying the quadrature signal $\cos \omega_{LO} t$ with the input signal Sd can be regarded as a real part component of a result of complex multiplication of the input signal Sd with a complex signal ($\cos \omega_{LO} t - j \sin \omega_{LO} t$). In the same way, the signal VQ can be regarded as an imaginary part component of the result of the complex multiplication. Accordingly, a signal (VI+j·VQ) as the complex multiplication result can be considered as a signal obtained by shifting respective frequency components of the input signal Sd exactly by $-\omega_{LO}$.

The input signal Sd is a real signal and has signal components at symmetric frequencies to the positive and negative sides as explained above. Accordingly, when shifting it exactly by an amount of a frequency $-\omega_{LO}$, positive frequency components shift to a lower range toward an original point, where there is no frequency, and negative frequency components shift to a higher range to be away from the original point.

The IF signal output portion 300 removes the negative frequency components shifting to a higher range by the low pass filter processing and extracts only the positive frequency components shifting to a lower range from the positive and negative signal components.

An operation of the phase-locked circuit shown in FIG. 17 will be explained.

When the input signal Sd has a desired frequency $\omega_{RF}$, that is, the input signal Sd=Vd·Cos $\omega_{RF} t$, the real part signal VI and the imaginary part signal VQ are expressed as the above formulas (14) and (15).

When higher frequency components are removed in the formulas (14) and (15), a real part component $Vif_I$ and an imaginary part component $Vif_Q$ of the IF signal _Vif are obtained.

Accordingly, the IF signal _Vif can be expressed as the formula below.

$$\underline{Vif} = Vif_I + j \cdot Vif_Q \qquad (22)$$
$$= \frac{Vd}{2} e^{j(\omega_{RF} - \omega_{LO})t}$$
$$= \frac{Vd}{2} e^{j\omega_{IF} t}$$

When the complex signal _Vlo generated by the complex signal generation portion 104 has a signal having a negative frequency $\omega_{IF}$, the complex signal _Vlo is expressed as the formula below.

$$\underline{Vlo} = Vlo_I + j Vlo_Q = e^{-j(\omega_{IF} t + \theta)} \qquad (23)$$

When assuming that the complex signal processor 100 is a multiplier of complex numbers, a calculation below is operated.

$$\underline{Vif} \cdot \underline{Vlo} = \frac{Vd}{2} e^{j\omega_{IF} t} \cdot e^{-j(\omega_{IF} t + \theta)} = \frac{Vd}{2} e^{-j\theta} \qquad (24)$$

As explained above, the complex signal processor 100 is provided with a circuit for calculating the imaginary part in the above formula. Accordingly, calculation operated in the complex signal processor 100 is as below.

$$Vpd = Vif_I \cdot Vlo_Q + Vif_Q \cdot Vlo_I \qquad (25)$$
$$= -\frac{Vd}{2} \cos \omega_{IF} t \cdot \sin(\omega_{IF} t + \theta) + \frac{Vd}{2} \sin \omega_{IF} t \cdot$$
$$\cos(\omega_{IF} t + \theta)$$
$$= -\frac{Vd}{2} \sin \theta$$

As is known form the formula (25), when inputting a signal Sd=Cos $\omega_{RF} t$ of the desired frequency $\omega_{RF}$, an output signal of the complex signal processor 100 becomes the same signal as the formula (8), so that a phase lock operation is possible in the complex signal processor 100 and the feedback portion 200.

Next, an operation of a phase-locked circuit on an image signal having the frequency $\omega_{image}$ will be explained.

An image signal _Vimage converted to have an intermediate frequency together with the desired frequency $\omega_{RF}$ and input to the complex signal processor 100 is expressed as the formula below.

$$\underline{Vimage} = Vimage_I + j \cdot Vimage_Q \qquad (26)$$
$$= \frac{Vim}{2} e^{j(\omega_{image} - \omega_{LO})t}$$

-continued $$= \frac{Vim}{2} e^{-j\omega_{IF}t}$$

Note that "Vim" indicates an amplitude of the image signal _Vimage.

When the image signal _Vimage is multiplied with a complex signal _Vlo of the complex signal generation portion 104, the result becomes as below.

$$\underline{Vimage} \cdot \underline{Vlo} = \frac{Vim}{2} e^{-j\omega_{IF}t} \cdot e^{-j(\omega_{IF}t+\theta)} \quad (27)$$

$$= \frac{Vim}{2} e^{-j(2\omega_{IF}t+\theta)}$$

In the complex signal generation portion 104, only an imaginary part of the formula (27) is calculated as explained next.

$$Vpd = Vimage_I \cdot Vlo_Q + Vimage_Q \cdot Vlo_I \quad (28)$$

$$= -\frac{Vim}{2} \text{Cos}\omega_{IF}t \cdot \text{Sin}(\omega_{IF}t + \theta) -$$

$$\frac{Vim}{2} \text{Sin}\omega_{IF}t \cdot \text{Cos}(\omega_{IF}t + \theta)$$

$$= -\frac{Vim}{2} \text{Sin}(2\omega_{IF}t + \theta)$$

As is known from the formula (28), the output signal Vpd of the complex signal processor 100 is a signal having a high frequency as $2\omega_{IF}$ and cannot be converged to a constant value by a filter of the feedback portion 200. Therefore, a phase of the complex signal_Vlo is not locked to the image signal _Vimage in this case.

As explained above, according to the phase-locked circuit shown in FIG. 17, in the IF signal output portion 300, the input signal Sd is multiplied respectively with two quadrature signals Cos $\omega_{LO}t$ and –Sin $\omega_{LO}t$ having a frequency $\omega_{LO}$ generated by the quadrature signal generation portion 400. Two signals VI and VQ as the multiplication results indicate one complex signal, wherein one is a real part and the other is an imaginary part, and this complex signal becomes what obtained by shifting a frequency of the input signal Sd exactly by an amount of a frequency $\omega_{LO}$ to the negative direction.

Next, the IF signal output portion 300 performs low pass filter processing for attenuating signal components having a higher frequency than the frequency $\omega_{RF}$ exactly by a frequency $\omega_{LO}$ respectively on the two signal components VI and VQ as the multiplication results. As a result, in components having symmetric frequencies to the positive and negative sides originally included in the input signal Sd, those shifting to a higher range by the above frequency shift are removed and those shifting to a lower range remain.

A complex signal after the filter processing is input as an IF signal_Vif to the same phase-locked circuit (a complex signal processor 100 and a feedback portion 200) as that in FIG. 1.

In the IF signal _Vif, original components of the input signal Sd remain as they are in a low frequency range not removed by the low pass filter processing, where an image signal _Vimage is also included. Therefore, when performing phase lock by using only a real part and imaginary part of the IF signal _Vif, it is interfered by an image signal _Vimage having a negative frequency ($\omega_{image}-\omega_{LO}$) existing symmetrically to the desired frequency ($\omega_{RF}-\omega_{LO}$) with respect to the zero-frequency point.

On the other hand, when locking the phase to the IF signal _Vif by using the same phase-locked circuit as that in FIG. 1, the phase is locked only to positive frequency components included therein, that is, signal components having the desired frequency ($\omega_{RF}-\omega_{LO}$), so that interference by the image signal _Vimage can be prevented.

As explained above, according to the present embodiment, for example in a radio communication system, the image problem at the time of converting a frequency can be solved with a very simple configuration without providing a circuit, such as a phase-shift circuit and a polyphase filter.

Figure 20:
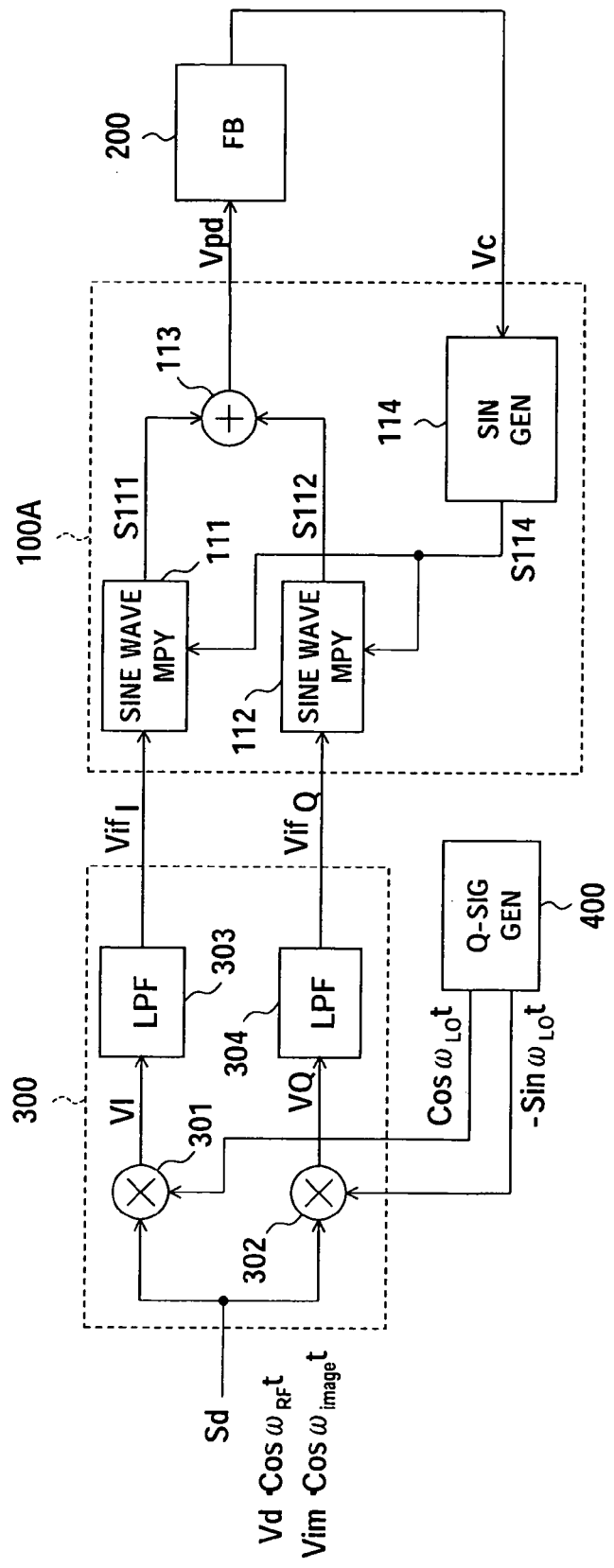
FIG. 20 is a view of another configuration example of the phase-locked circuit according to the third embodiment.

Note that the phase-locked circuit shown in FIG. 1 is used in the above embodiments, but it is possible to configure by replacing it with the phase-locked circuit shown in FIG. 9 as shown in FIG. 20.

In this case, as to generation of an output signal corresponding to the second complex signal _Vlo shown in FIG. 1, a pseudo sine wave may be generated, for example, by providing a circuit having the same configuration as the sine wave multiplier shown in FIG. 10 and FIG. 13 and fixing the input signal to a constant value. Alternately, a circuit for performing frequency dividing on the signal S114 of the signal generation portion 114 may be provided to generate a pulse output signal.

Fourth Embodiment

Next, a fourth embodiment of the present invention will be explained.

The present embodiment is an example of applying the phase-locked circuit of the present invention to signal processing of a resolver angle sensor.

Figure 21:
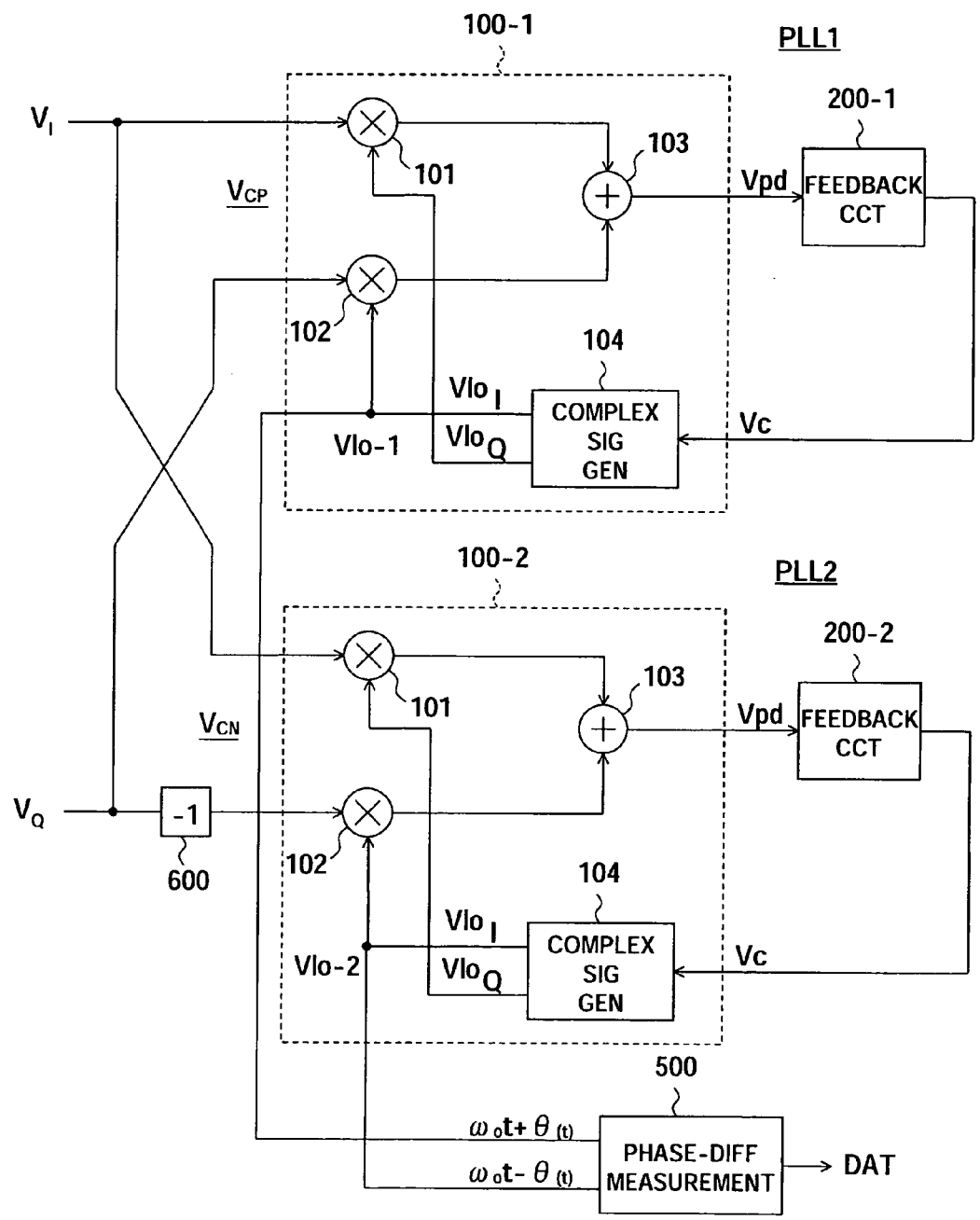
FIG. 21 is a view of an example of the configuration of a phase-locked circuit according to a fourth embodiment.

FIG. 21 is a view of an example of the configuration of a phase-locked circuit according to the present embodiment.

Before explaining the phase-locked circuit shown in FIG. 21, a resolver angle sensor will be explained.

Figure 23:
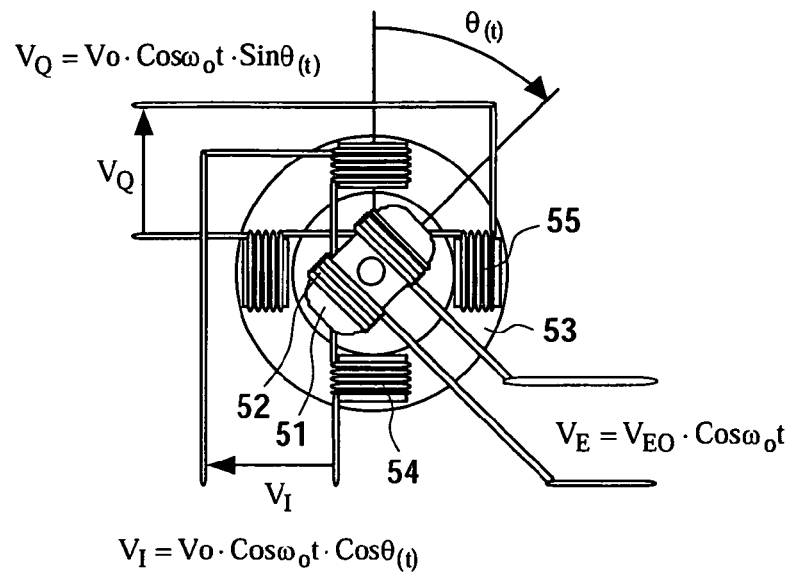
FIG. 23 is a view of an example of a one-phase excitation two-phase output type resolver angle sensor.

There are known methods of detecting a mechanical angle and position by using electromagnetic induction. A mechanical angle sensor is called a resolver angle sensor and principally has a similar configuration to that of a motor as shown in FIG. 23.

A coil 52 wound around a rotor 51 is excited by an excitation signal VE having a frequency $\omega_o$, and two coils 54 and 55 are arranged at right angles on a stator 53. When the rotor 51 rotates exactly by an angle θ(t) about a rotation axis, signals VI and VQ as in the formulas below are induced to the coils 54 and 55.

$$V_I = Vo \cdot \text{Cos } \omega_o t \cdot \text{Cos } \theta_{(t)} \quad (29)$$

$$V_Q = Vo \cdot \text{Cos } \omega_o t \cdot \text{Sin } \theta_{(t)} \quad (30)$$

Calculation of an angle θ(t) from the signals VI and VQ is a proposition of an angle calculation signal processing circuit of a resolver angle sensor, and particularly, a signal processing circuit for outputting an angle in digital data is called an R-D (resolver-digital) conversion circuit. A resolver angle sensor is basically composed of a rotor, a stator and a coil made by a magnetized material, so that it has excellent characteristics of being robust and hard to be affected by an effect of an environment, such as dirt and temperature.

Very various configurations are proposed on a resolver angle sensor. FIG. 23 shows the principal configuration, wherein a rotary brush for supplying an excitation current to the rotor is necessary. To omit the rotary brush, use of a rotary transformer, a new configuration of not providing a coil to the rotor and exciting by the coil of the stator, and a configuration of sensing by the stator a magnetic flux change caused by a change of a gap of the rotor and the stator, etc. are proposed.

Hereinafter, a resolver angle sensor for outputting signals as expressed in the formula (29) and the formula (30) will be called a one-phase excitation two-phase output type.

When focusing on a signal obtained as an output from the resolver angle sensor among the variety of configurations as above, as indicated in the formulas (29) and (30), a one-phase excitation two-phase output type resolver angle sensor for outputting a signal obtained by modulating an excitation signal by a cosine function Cos θ(t) and a sine function Sin θ(t) of a shaft rotation angle θ(t) is most generally used.

Figures 24A, 24B:
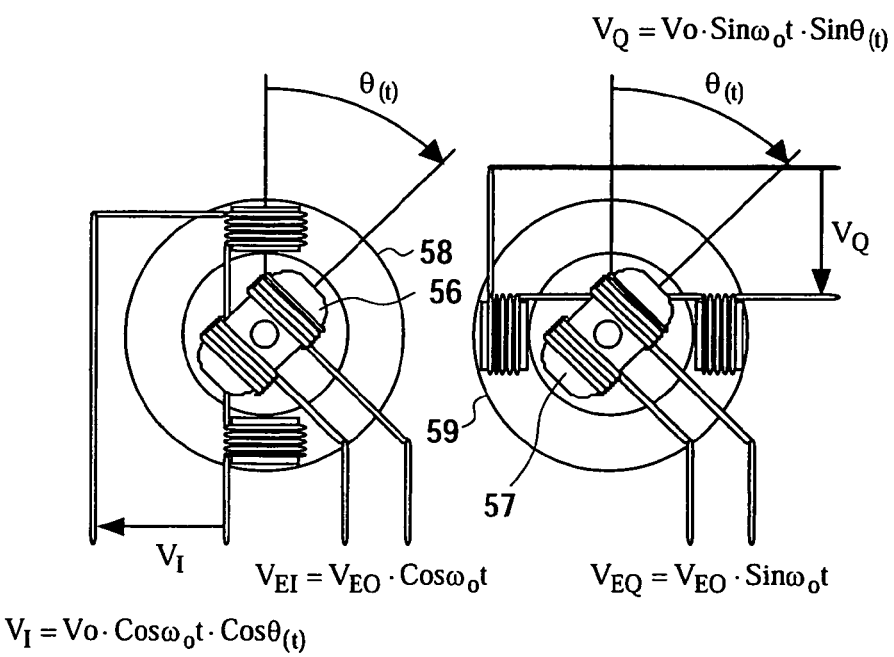
FIG. 24A and FIG. 24B are views of an example of a two-phase excitation two-phase output type resolver angle sensor.

On the other hand, in terms of convenience of signal processing, it is the most convenient to output a product of cosine functions Cos ω₀t×Cos θ(t) and a product of sine functions Sin ω₀t×Sin θ(t). However, to obtain such a signal, it is necessary to prepare two sets of independent rotors 56 and 57 and stators 58 and 59 as shown in FIG. 24A and FIG. 24B and configuring them on the same axis. This method is called a two-phase excitation two-phase output type, by which signal processing-becomes very simple. However, structural disadvantages are large, such that independent two sets of rotor and stator are necessary, the mechanical structure is complicated, and it is configured to be thick, so that it is used only in a limited way.

Reasons that the signal processing in the two-phase excitation two-phase output type becomes easy will be plainly explained.

Outputs VI and VQ of the two-phase excitation two-phase output type resolver angle sensor are expressed by the formulas below.

$$V_I = V_o \cdot \cos\omega_o t \cdot \cos\theta_{(t)} \quad (31)$$
$$= \frac{1}{2}\{\cos(\omega_o t + \theta_{(t)}) + \cos(\omega_o t - \theta_{(t)})\}$$

$$V_Q = V_o \cdot \sin\omega_o t \cdot \sin\theta_{(t)} \quad (32)$$
$$= \frac{1}{2}\{\cos(\omega_o t + \theta_{(t)}) + \cos(\omega_o t - \theta_{(t)})\}$$

From the above formulas, cosine functions Cos(ω₀t+θ(t)) and Cos(ω₀t−θ(t)) are obtained easily.

$$V_P = V_I + V_Q = \cos(\omega_o t + \theta_{(t)}) \quad (33)$$

$$V_N = V_I - V_Q = \cos(\omega_o t - \theta_{(t)}) \quad (34)$$

When the signal can be converted as above, for example, an angle θ(t) can be obtained, for example, by measuring a time difference at a zero crossing point of the two signals.

However, the signals expressed by the formulas (31) and (32) are not output from a one-phase excitation two-phase output type resolver angle sensor having a simple configuration shown in FIG. 23. Accordingly, for example, a method of measuring the zero cross point as above cannot be applied. As a result, there were only options of obtaining angle data by simple signal processing by using a two-phase excitation two-phase output type resolver angle sensor having a complicated configuration as shown in FIG. 23 as an example, or obtaining angle data by performing very complicated signal processing on the output signals expressed by the formulas (29) and (30) by using a one-phase excitation two-phase output type resolver angle sensor.

The phase-locked circuit according to the present embodiment enables to obtain an angle by a very simple signal processing by a one-phase excitation two-phase output type resolver angle sensor.

The phase-locked circuit shown in FIG. 21 includes a first phase-locked circuit PLL1 including a complex signal processor 100-1 and a feedback portion 200-1, a second phase-locked circuit PLL2 including a complex signal processor 100-2 and a feedback portion 200-2, a phase difference measuring portion 500 and a polarity inversion circuit 600.

The first phase-locked circuit PLL1 is an embodiment of a first phase-locked circuit of the present invention.

The second phase-locked circuit PLL2 is an embodiment of a second phase-locked circuit of the present invention.

The polarity inversion circuit 600 is an embodiment of a polarity inversion circuit of the present invention.

The polarity inversion circuit inverts a polarity of an output signal VQ from the one-phase excitation two-phase output type resolver angle sensor indicated by the formula (30).

The complex signal processors 100-1 and 100-2 have the same configuration as that of the complex signal processor 100 explained above and operate in the same way.

A complex signal _V_CP_ including the signal V_I_ of the formula (29) as the real part component and the signal V_Q_ of the formula (30) as the imaginary part component is input to the complex signal processor 100-1. A complex signal generation portion 104 of the complex signal processor 100-1 outputs a complex signal _Vlo-1 in synchronization with a signal of a positive frequency component included in the complex signal _V_CP_.

Also, a complex signal _V_CN_ including the signal V_I_ as the real part component and an output signal (that is, a signal −V_Q_) of the polarity inversion circuit 600 as the imaginary part component is input to the complex signal processor 100-2. A complex signal generation portion 104 of the complex signal processor 100-2 outputs a complex signal _Vlo-2 in synchronization with a signal of a positive frequency component included in the complex signal _V_CN_.

The feedback portions 200-1 and 200-2 have the same configuration as that of the feedback portion 200 explained above and operate in the same way.

The feedback portion 200-1 receives as an input a signal Vpd generated by the complex signal processor 100-1 and outputs a feedback control signal Vc in accordance therewith to the complex signal processor 100-1.

The feedback portion 200-2 receives as an input a signal Vpd generated by the complex signal processor 100-2 and outputs a feedback control signal Vc in accordance therewith to the complex signal processor 100-2.

The phase difference measuring portion 500 measures a phase difference between a real part component of the complex signal Vlo-1 output from the first phase-locked circuit PLL1 and a real part component of the complex signal Vlo-2 output from the second phase-locked circuit PLL2.

As will be explained later on, when comparing real part components and imaginary part components of the complex signal _Vlo-1, a phase of which is locked to a positive frequency of the signal V_CP_ in the first phase-locked circuit PLL1, and the complex signal _Vlo-2, a phase of which is locked to a positive frequency component of the signal V_CN_ in the second phase-locked circuit PLL2, in the same way as the two signals expressed by the formulas (33) and (34), there is a phase difference in accordance with an angle θ. The phase difference measuring portion 500 measures the phase difference, for example, based on a time difference at the zero crossing point.

Figure 22:
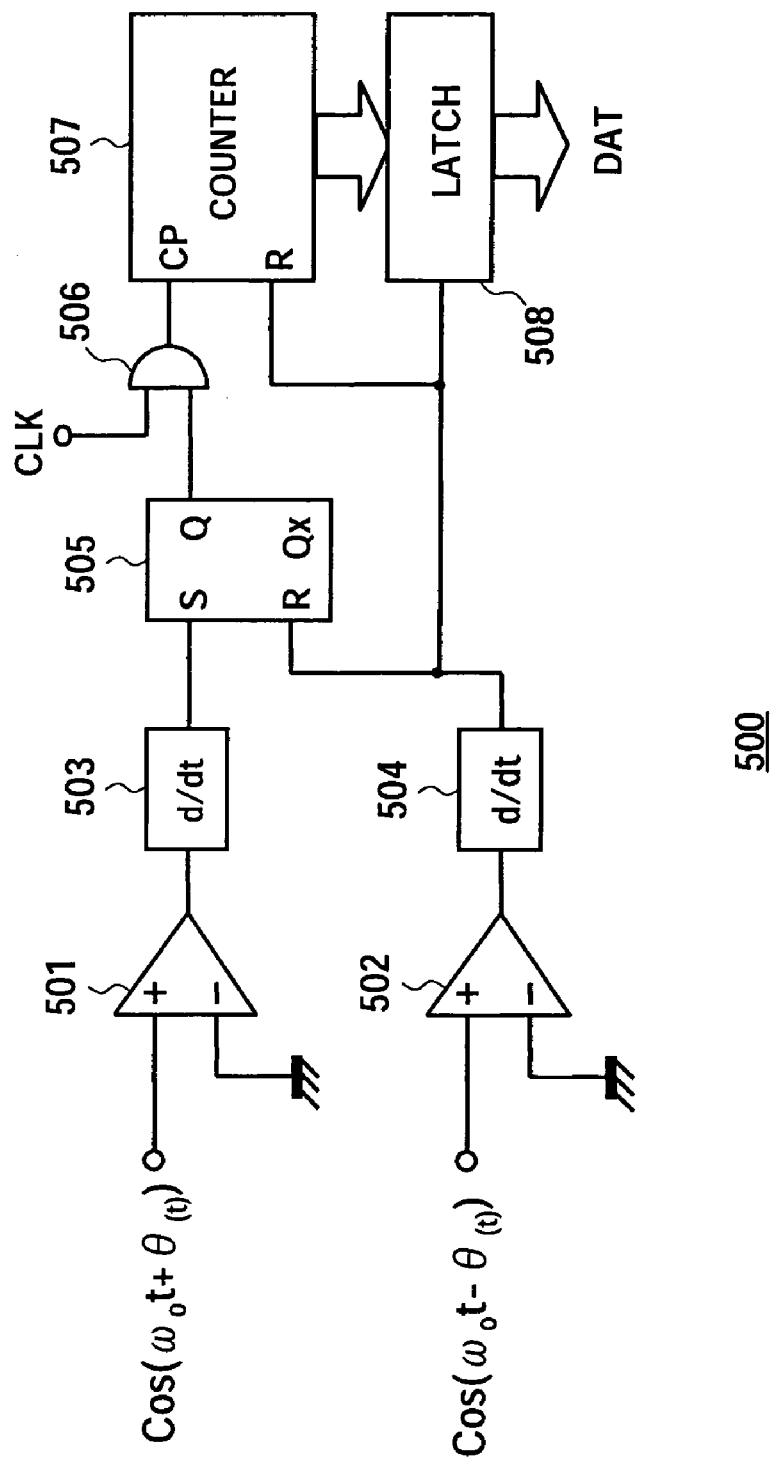
FIG. 22 is a view of an example of the configuration of a phase difference measuring circuit.

FIG. 22 is a view of an example of the configuration of the phase difference measuring circuit 500.

The phase difference measuring circuit 500 has comparators 501 and 502, differentiation circuits 503 and 504, an S-R flip-flop 505, an AND circuit 506, a counter 507 and a latch circuit 508.

The comparator 501 receives as an input a real part component of the complex signal _Vlo-1 generated by the complex signal processor 100-1 and compares it with a zero level. When the real part component is larger than the zero level, the comparator 501 outputs a high level, while when smaller than the zero level, outputs a low level.

The comparator 502 receives as an input a real part component of the complex signal _Vlo-2 generated by the complex signal processor 100-2 and compares it with a zero level. When the real part component is larger than the zero level, the comparator 502 outputs a high level, while when smaller than the zero level, outputs a low level.

The differentiation circuits 503 and 504 receive as an input output signals of the comparators 501 and 502, differentiate the same and, when a differentiation value is a predetermined level or larger, output a pulse at a high level at rising.

The flip-flop 505 is set and outputs a high level when receiving the pulse signal from the differentiation circuit 503, and it is reset and resets the output at a high level to be a low level when receiving the pulse signal from the differentiation circuit 504.

The AND circuit 506 outputs a logical AND of the output signal of the flip-flop 505 and a clock signal CLK.

The counter 507 counts the number of pulses of the clock signal input via the AND circuit 506, and resets the counted value to zero when a pulse signal from the differentiation circuit 503 is input.

The latch circuit 508 latches the counted value by the counter 507 and outputs the same when the pulse signal from the differentiation circuit 503 is input.

An operation of the phase difference measuring circuit 500 will be explained.

In the explanation below, it is assumed that an input signal (a real part component of the complex signal _Vlo-1) of the comparator 501 changes from negative to positive in a state where the counted value of the counter 507 is zero, after that, an input signal (a real part component of the complex signal _Vlo-2) of the comparator 502 changes from negative to positive.

In this case, the output of the comparator 501 rises from a low level to a high level first and a pulse is output from the differentiation circuit 503. As a result, an output of the flip-flop 505 becomes a high level, the clock signal CLK transmits through the AND circuit 506 and input to the counter 507, and counting by the counter 507 starts.

Next, when an input signal of the comparator 502 crosses zero and the output signal changes from a low level to a high level, the counted value of the counter 507 is latched by the latch circuit 508 due to a pulse by the differentiation circuit 504 and output as data DAT. Also, the flip-flop 505 and the counter 507 are reset.

As explained above, the data DAT in accordance with a time difference at zero crossing points of the two input signals is obtained.

Next, the reason why the real part components of the complex signals _Vlo generated in the two phase-locked circuits PLL1 and PLL2 have a phase difference in accordance with the angle θ will be explained.

The output signals $V_I$ and $V_Q$ of the one-phase excitation two-phase output type resolver angle sensor having a simple configuration are as expressed by the formulas (29) and (30), and producing of signals expressed by the formulas (33) and (34) from the above signals is a proposition of a certain kind of R-D (resolver-digital) conversion signal processing circuit, which is already explained above.

Figure 25A:
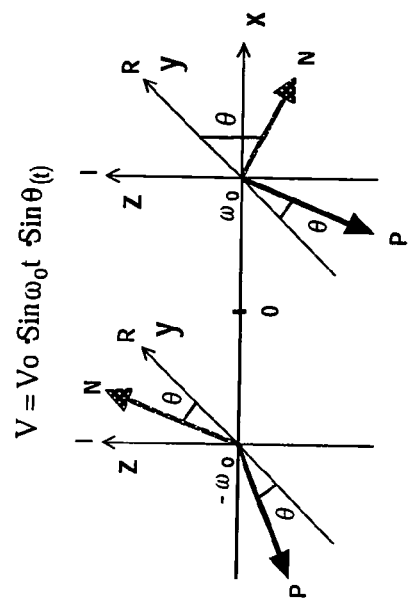
FIG. 25A to FIG. 25C are views wherein two output signals of a resolver angle sensor are expressed as vectors of a complex frequency.
Figure 25B:
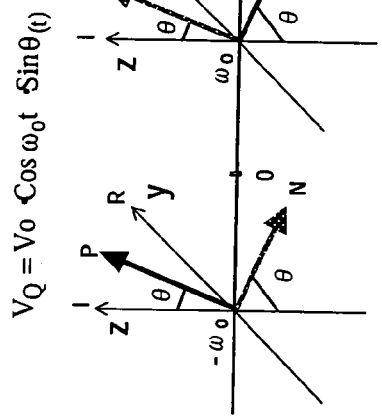
Figure 25C:
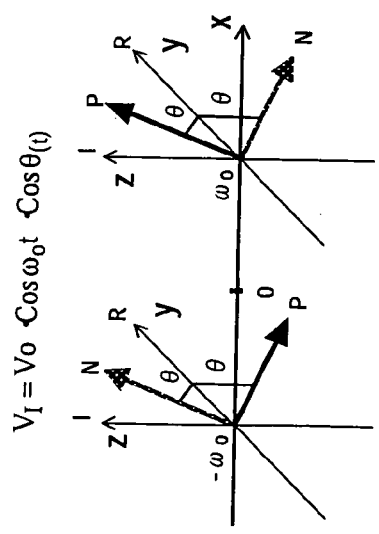

FIG. 25A to FIG. 25C express the output signals $V_I$ and $V_Q$ of the resolver angle sensor as a vector of a complex frequency.

The "P" and "N" in FIGS. 25A and 25B indicate a relationship of a polarity of a frequency $\omega_o$ and a polarity of an angle θ. Namely, a vector of rotating the angle θ(t) in the anticlockwise direction at a positive frequency $\omega_o$ is defined as a positive signal vector $(\omega_o t+\theta(t))$, and a vector of rotating in the clockwise direction is defined as a negative signal vector $(\omega_o t-\theta(t))$, and expressed by "P" and "N", respectively. Also, a vector of rotating the angle θ(t) in the clockwise direction at a negative frequency $-\omega_o$ is defined as a positive signal vector $(-\omega_o t+\theta(t))$, and a vector of rotating in the anticlockwise direction is defined as a negative signal vector $(-\omega_o t-\theta(t))$, and expressed by "P" and "N", respectively.

To put it in other way, a vector, wherein polarities of the frequency $\omega_o$ and the angle θ are the same, is expressed as a positive vector "P", and a vector, wherein polarities of the frequency $\omega_o$ and the angle θ are different, is expressed as a negative vector "N".

As shown in FIG. 25A and FIG. 25B, in the output signals $V_I$ and $V_Q$ of the resolver angle sensor, a positive signal vector and a negative signal vector exist together at the same frequency, so that they cannot be divided if nothing is done.

When returning to the two-phase excitation two-phase output type resolver, a vector of "Sin $\omega_o t \times$ Sin θ(t)" can be expressed as in FIG. 25C. This signal can be easily converted to "Cos($\omega_o t+\theta(t)$)" and "Cos($\omega_o t-\theta(t)$)" by calculating a sum and difference with "Cos($\omega_o t \times$ Cos θ(t))", which is explained above.

Here, when comparing "Cos $\omega_o t \times$ Sin θ(t)" in FIG. 25B with "Sin $\omega_o t \times$ Sin θ(t)" in FIG. 25C by focusing on a positive frequency, it is known that it can be converted to "Sin $\omega_o t \times$ Sin θ(t)" by rotating "Cos $\omega_o t \times$ Sin θ(t)" in the clockwise direction, that is, by −90°.

Figure 26:
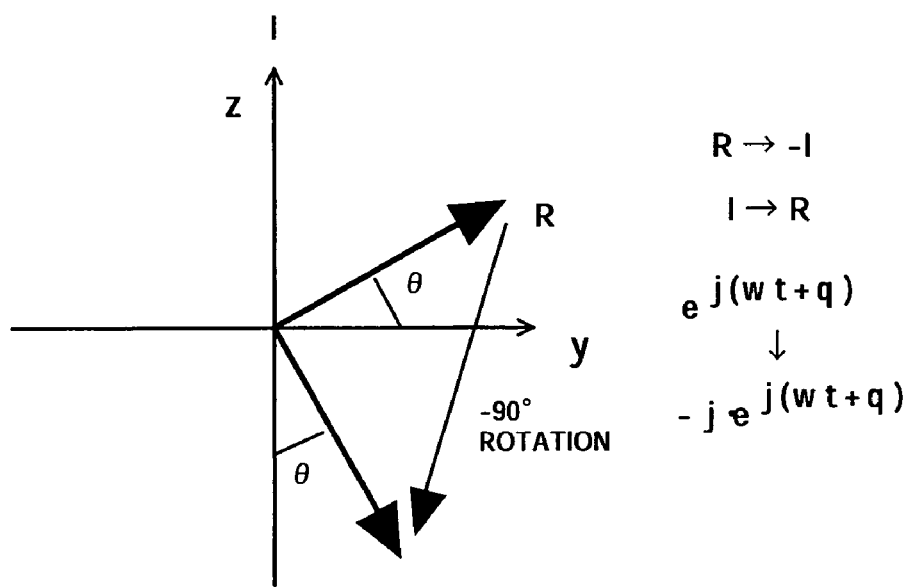
FIG. 26 is a view for explaining an operation of rotating a vector by −90°.

An operation shown in FIG. 26 is performed to rotate a vector by −90°. Namely, it is sufficient if a real part is made to be a negative imaginary part and an imaginary part to a real part.

From the above, "Cos $\omega_o t \times$ Sin θ(t)" is rotated by −90° by the operation in FIG. 26, and a signal obtained by the rotation and "Cos $\omega_o t \times$ Cos θ(t)" are added and subtracted.

FIG. 27 illustrates a state of the above calculation by a vector.

When looking at a calculation result of the lowermost stage in FIG. 27, it is known that components having the same frequency in the two complex signals obtained by the adding and subtracting have a mutual phase difference of "2×θ".

However, in the complex signals of the calculation result shown in FIG. 26, there are vectors inversely rotating to positive and negative frequencies. Thus, when using the phase-locked circuit explained in the above embodiments to take out only signal components at a positive frequency, signals equivalent to the formulas (33) and (34) can be obtained.

Figure 28:
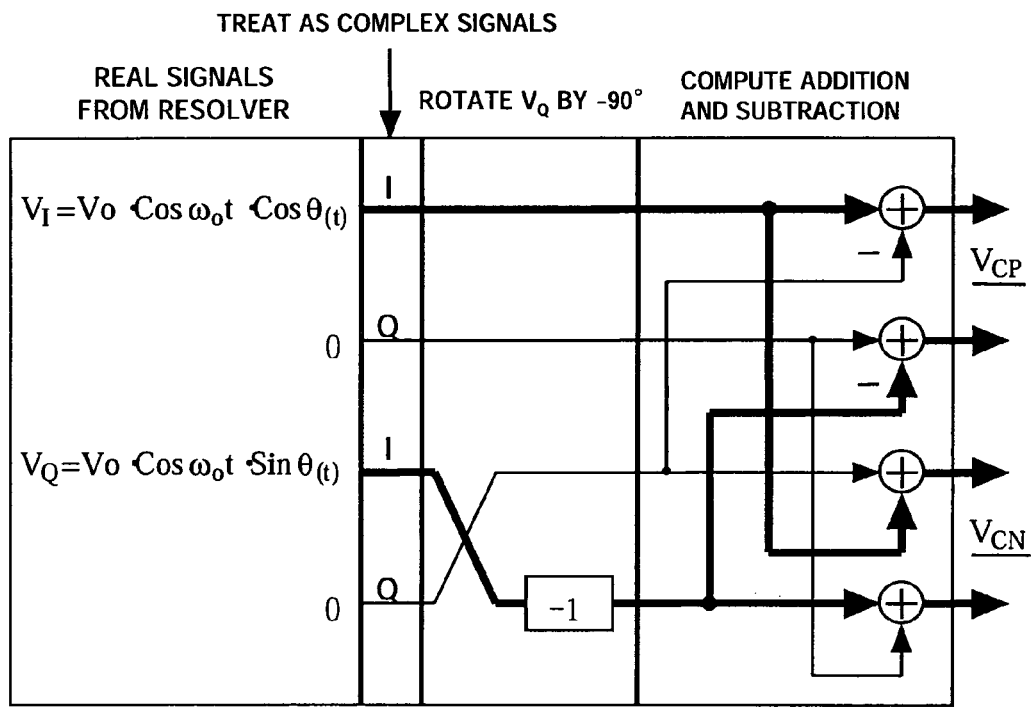
FIG. 28 is a block diagram of complex signal processing performed in the present embodiment.

FIG. 28 is a block diagram of the above signal processing.

Here, the output signals $V_I$ and $V_Q$ of the resolver angle sensor are treated as complex signals. The signals $V_I$ and $V_Q$ themselves are real signals, so that an imaginary part is zero.

Next, to rotate the signal $V_Q$ by −90°, the real part and the imaginary part are exchanged and the imaginary part is inverted. When adding and subtracting them as complex signals, a subtraction output signal $V_{CP}$ and an adding output signal $V_{CN}$ shown in FIG. 27 are obtained.

A path illustrated by a thick line in FIG. 28 is for an output signal of the resolver angle sensor to pass. However, the path illustrated by a thin line is an imaginary part of an original signal, so that a signal does not actually exist. Accordingly, by omitting the path, the signal processing in FIG. 28 can be simplified as that in FIG. 29.

Figure 29:
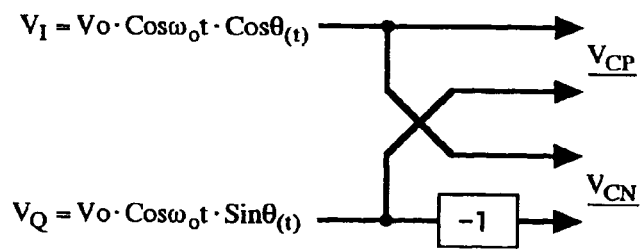
FIG. 29 is a simplified view of a flow of a signal in the block diagram shown in FIG. 28.

Signal processing in FIG. 29 is expressed by the formula below.

$$\underline{V_{CP}} = V_I + j \cdot V_Q \quad (35)$$

$$= \frac{Vo}{4}(e^{j\omega t} + e^{-j\omega t})(e^{j\theta(t)} + e^{-j\theta(t)}) +$$

$$j\frac{Vo}{4}(e^{j\omega t} + e^{-j\omega t})(-j \cdot e^{j\theta(t)} + j \cdot e^{-j\theta(t)})$$

$$= \frac{Vo}{2}e^{j\theta(t)}(e^{j\omega t} + e^{-j\omega t})$$

$$= \frac{Vo}{2}\left(e^{j(\omega t+\theta(t))} + e^{-j(\omega t-\theta(t))}\right)$$

$$\underline{V_{CN}} = V_I - j \cdot V_Q \quad (36)$$

$$= \frac{Vo}{4}(e^{j\omega t} + e^{-j\omega t})(e^{j\theta(t)} + e^{-j\theta(t)}) -$$

$$j\frac{Vo}{4}(e^{j\omega t} + e^{-j\omega t})(-j \cdot e^{j\theta(t)} + j \cdot e^{-j\theta(t)})$$

$$= \frac{Vo}{2}e^{-j\theta(t)}(e^{j\omega t} + e^{-j\omega t})$$

$$= \frac{Vo}{2}\left(e^{j(\omega t-\theta(t))} + e^{-j(\omega t+\theta(t))}\right)$$

Accordingly, an output complex signal _Vlo-1 of the first phase-locked circuit PLL1, a phase of which is locked to a positive frequency component of the signal $V_{CP}$, becomes as below from the formula (35).

$$Vlo\text{-}1 = Vo\{\cos(\omega t + \theta(t)) + j \cdot \sin(\omega t + \theta(t))\}/2$$

Also, an output complex signal _Vlo-2 of the second phase-locked circuit PLL2, a phase of which is locked to a positive frequency component of the signal $V_{CN}$, becomes as below from the formula (36).

$$Vlo\text{-}2 = Vo\{\cos(\omega t - \theta(t)) + j \cdot \sin(\omega t - \theta(t))\}/2$$

Accordingly, by measuring a phase difference of their real part components $Vo \cdot \cos(\omega t + \theta(t))/2$ and $Vo \cdot \cos(\omega t - \theta(t))/2$ by the phase difference measuring portion 500, data of an angle $\theta(t)$ can be obtained.

As explained above, the phase-locked circuit according to the present embodiment receives, as an output signal of the one-phase excitation two-phase output type resolver angle sensor, a signal $V_I$ being in proportional to a product $\cos \omega_o t \times \cos \theta(t)$ of a cosine function $\cos \omega_o t$ having a frequency $\omega_o$ and a cosine function $\cos \theta(t)$ having an angle $\theta(t)$ and a signal $V_Q$ being in proportional to a product $\cos \omega_o t \times \sin \theta(t)$ of a cosine function $\cos \omega_o t$ having a frequency $\omega_o$ and a sine function $\sin \theta(t)$ having an angle $\theta(t)$.

The first phase-locked circuit PLL1 receives as an input a complex signal $\underline{V_{CP}}$, wherein the input signal $V_I$ is a real part component and the signal $V_Q$ is an imaginary part component. The complex signal $\underline{V_{CP}}$ includes a component having a positive frequency $\omega_o$ and a component having a negative frequency $-\omega_o$.

Also, the second phase-locked circuit PLL2 receives as an input a complex signal $\underline{V_{CN}}$, wherein the input signal $V_I$ is a real part component and a polarity inversion signal $-V_Q$ of the signal $V_Q$ is an imaginary part component. The complex signal $\underline{V_{CN}}$ also includes a component having a positive frequency $\omega_o$ and a component having a negative frequency $-\omega_o$.

Note that when comparing components having the same polarity in the complex signals $\underline{V_{CP}}$ and $\underline{V_{CN}}$ to be input to the phase locked circuits PLL1 And PLL2, there is a phase difference of two times the angle $\theta(t)$ in both of positive and negative frequencies.

Both of the complex signal _Vlo-1 output by the first phase-locked circuit PLL1 and the complex signal _Vlo-2 output by the second phase-locked circuit PLL2 become a signal having a phase locked to a component having a high frequency included in the input complex signals $\underline{V_{CP}}$ and $\underline{V_{CN}}$. Therefore, a phase difference of the two is locked to a phase difference in accordance with two times the angle $\theta(t)$.

According to the present embodiment, it is possible to realize with a very simple configuration angle calculation by a one-phase excitation two-phase output type resolver angle sensor, wherein processing was complicated in the related art.

Figure 30:
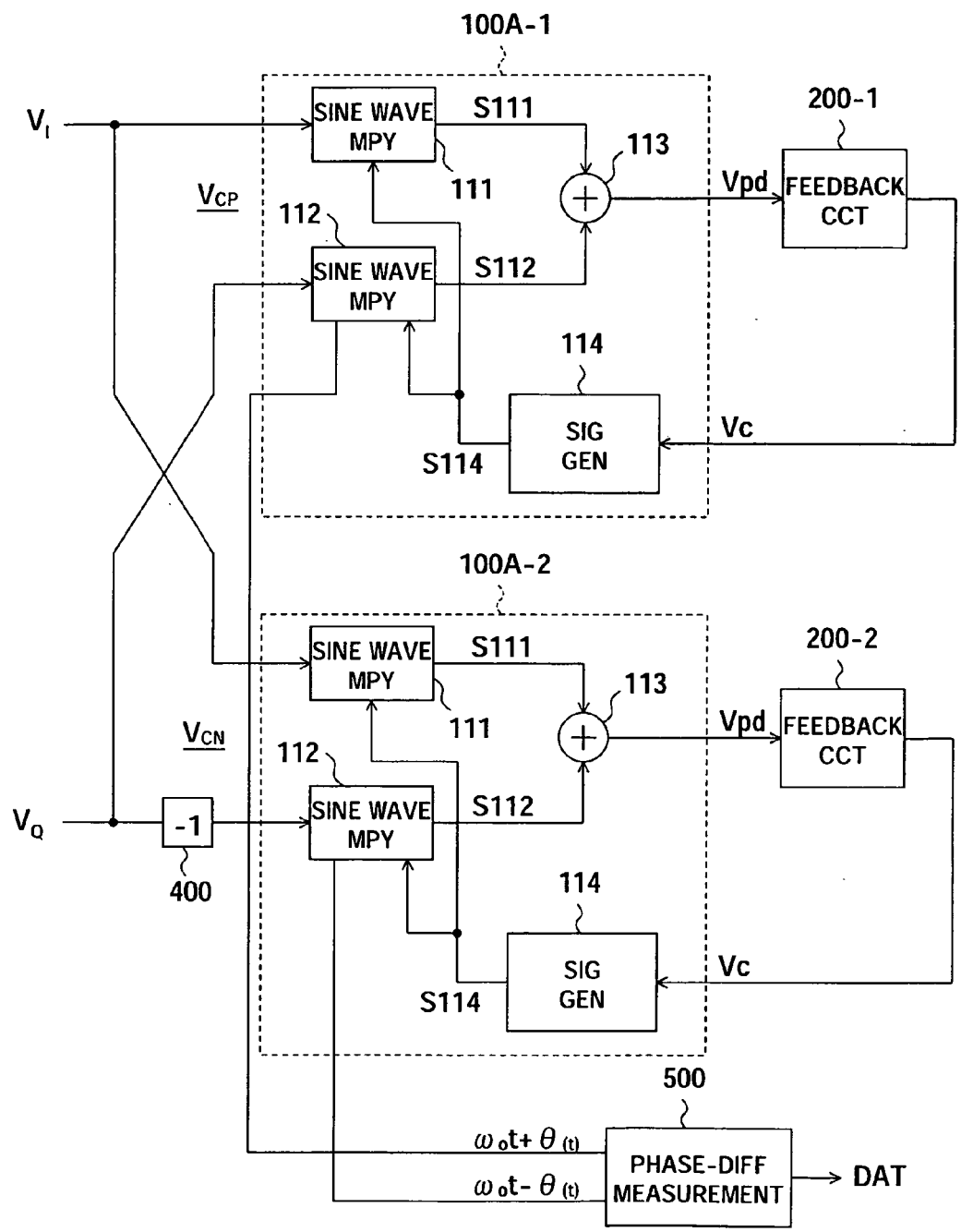
FIG. 30 is a view of another configuration example of a phase-locked circuit according to a fourth embodiment.
Figure 33:
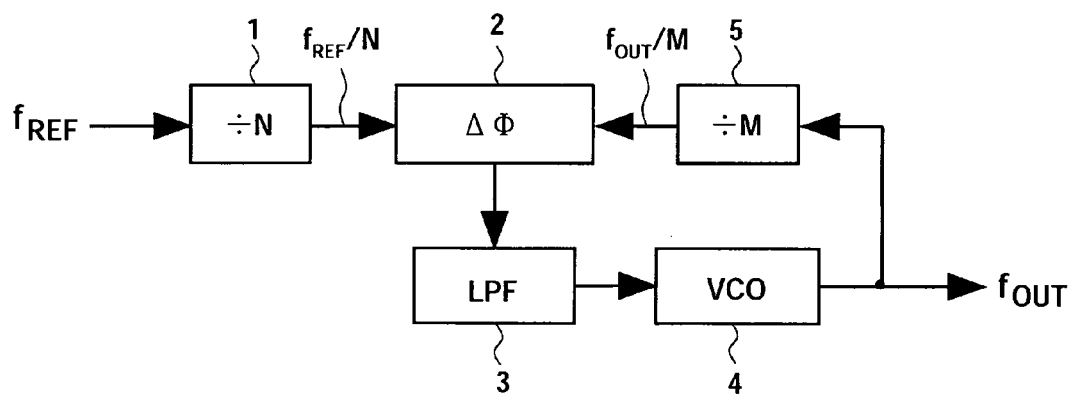
FIG. 33 is a view of an example of a frequency synthesizer using a PLL.

Note that the phase-locked circuit shown in FIG. 1 is used in the above embodiments, but it can be configured by replacing this with the phase-locked circuit shown in FIG. 9 as shown in FIG. 30.

In this case, as signals replacing the complex Signals _Vlo-1 and _Vlo-2 in the phase-locked circuit in FIG. 21, for example, signals having the same frequency as the complex signals _Vlo-1 and _Vlo-2, such as a control signal of the polarity selection switch SWp in FIG. 11A and a control signal of the polarity selection switches SW5 and SW6 in FIG. 14A, may be used for measuring a phase difference.

A plurality of embodiments of the present invention were explained above, but the present invention is not limited to the above embodiments and includes a variety of modifications.

In the phase-locked circuit of the above embodiments, a signal in accordance with a real part or an imaginary part of a complex signal obtained by multiplying a first complex signal _Vin and a second complex signal _Vlo is input to the feedback portion, but the present invention is not limited to this. For example, a declination of a complex signal obtained by multiplying the first complex signal _Vin and the second complex signal _Vlo may be directly calculated and the calculation result may be input to the feedback portion.

Also, in the above embodiments, a phase-locked circuit for locking a phase only to a signal component of a positive frequency is explained as an example, but the present invention is not limited to this and a phase-locked circuit for locking a phase only to a signal component of a negative frequency can be also realized by using the embodiments of the present invention.

In the third embodiment, an example of shifting an input signal from a high frequency to a low frequency is described, but a circuit for shifting the input signal from a low frequency to a high frequency can be realized in the same way by using the present invention.

In the above embodiments, examples of applying the present invention to frequency conversion processing and angle calculation processing of a resolver angle sensor are described, but the present invention is not limited to them and can be widely applied to a variety of other signal processing for performing processing by using a complex signal.

It should be understood by those skilled in the art that various modifications, combinations, sub-combinations and alternations may occur depending on design requirements and other factors insofar as they are within the scope of the appended claims or the equivalents thereof.

What is claimed is:

1. A phase-locked circuit, comprising
a complex signal processor, and
a feedback portion,
wherein:
said complex signal processor receives as an input a first complex signal composed of a real part component and an imaginary part component, phases of which are mutually perpendicular at a first frequency; generates a second complex signal composed of a first signal component and a second signal component and having a second frequency in accordance with a feedback control signal input from said feedback portion, wherein the second frequency is set to have a predetermined polarity; and generates a signal in accordance with a declination of a third complex signal obtained by multiplying said first complex signal with said second complex signal and outputs to said feedback portion;
said feedback portion generates said feedback control signal in accordance with a signal input from said complex signal processor, so that said declination converges to a constant value; and
said complex signal processor synchronizes a phase of said second complex signal with said first complex signal and outputs;
wherein said complex signal processor comprises:
a complex signal generation portion for respectively generating said first signal component and said second signal component having a frequency in accordance with said feedback control signal, wherein phases are mutually perpendicular,
a first calculation portion for multiplying said first signal component generated by said complex signal generation portion with the real part component of said first complex signal,
a second calculation portion for multiplying said second signal component generated by said complex signal generation portion with the imaginary part component of said first complex signal, and
a third calculation portion for calculating a sum or difference of multiplication results of said first calculation portion and said second calculation portion;
wherein said complex signal generation portion comprises:
a signal generation portion for generating a signal having a frequency in accordance with said feedback control signal,
cascade-connected m-stage (m indicates positive even numbers) flip-flop, wherein each successively transmits an input signal to a subsequent stage in synchronization with a signal generated by said signal generation portion, and
an inverter for performing logical inversion on an output signal of a final stage of said cascade-connected flip-flop and inputting to the initial stage;
wherein two signals, phases of which are different by ¼ cycle, among signals input to or output from said cascade-connected flip-flop are output as said first signal component and said second signal component.

2. A phase-locked circuit as set forth in claim 1, wherein said complex signal processor comprises
a signal generation portion for generating a signal having a frequency in accordance with said feedback control signal,
a fourth calculation portion for selecting for each cycle of a signal generated by said signal generation portion a coefficient value in accordance with an instantaneous value for said first signal component to have in the cycle from a plurality of predetermined coefficient values, and multiplying the selected coefficient value with a real part component of said first complex signal,
a fifth calculation portion for selecting for each cycle of a signal generated by said signal generation portion a coefficient value in accordance with an instantaneous value for said second signal component to have in the cycle from a plurality of predetermined coefficient values, and multiplying the selected coefficient value with an imaginary part component of said first complex signal, and
a sixth calculation portion for calculating a sum or difference of multiplication results of said fourth calculation portion and said fifth calculation portion.

3. A phase-locked circuit as set forth in claim 2, wherein:
said signal generation portion generates a signal having a 1/k (k indicates positive multiples of 4) cycle for said first signal component and said second signal component;
said fourth calculation portion selects a coefficient value in accordance with an instantaneous value in every 1/k cycle of said first signal component; and
said fifth calculation portion selects a coefficient value in accordance with an instantaneous value in every 1/k cycle of said second signal component.

4. A phase-locked circuit as set forth in claim 1, wherein said feedback portion comprises a filter circuit for amplifying a direct-current component of a signal generated by said complex signal processor by a predetermined transmission characteristic and outputting as said feedback control signal.

5. A phase-locked circuit for locking a phase of an output signal to a signal having a frequency shifted exactly by an amount of a second frequency from a signal having a first frequency included in an input signal, comprising:
a quadrature signal generation portion for generating two quadrature signals having said second frequency, wherein phases are mutually perpendicular;
a first complex signal output portion for multiplying two quadrature signals generated by said quadrature signal generation portion respectively with said input signal, performing on two signals as the multiplication results filter processing for attenuating components at a higher frequency or a lower frequency than said first frequency exactly by an amount of said second frequency, and outputting a first complex signal wherein one of two signals after the filter processing is a real part component and the other is an imaginary part component;
a complex signal processor for generating a signal in accordance with a declination of a complex signal obtained by multiplying a second complex signal having a frequency in accordance with a feedback control signal to be input, wherein the frequency is set to have a predetermined polarity, with said first complex signal, and
a feedback portion for generating said feedback control signal for controlling feedback in accordance with a signal generated by said complex signal processor, so that said declination converges to a constant value;
wherein said complex signal processor outputs as said output signal at least one of a first signal component and a second signal component having mutually perpendicular phases included in said second complex signal or a signal synchronized with the signal component,
wherein said complex signal processor comprises:

a signal generation portion for generating a signal having a frequency in accordance with said feedback control signal, a fourth calculation portion for selecting for each cycle of a signal generated by said signal-generation portion a coefficient value in accordance with an instantaneous value for said first signal component to have in the cycle from a plurality of predetermined coefficient values and multiplying the selected coefficient value with a real part component of said first complex signal, a fifth calculation portion for selecting for each cycle of a signal generated by said signal generation portion a coefficient value in accordance with an instantaneous value for said second signal component to have in the cycle from a plurality of predetermined coefficient values and multiplying the selected coefficient value with an imaginary part component of said first complex signal, and a sixth calculation portion for calculating a sum or difference of multiplication results of said fourth calculation portion and said fifth calculation portion.

6. A phase-locked circuit as set forth in claim 5, wherein:

said complex signal processor generates as a signal in accordance with said declination a signal in accordance with a real part or an imaginary part of a complex signal obtained by multiplying said first complex signal with said second complex signal; and said feedback portion generates said feedback control signal for controlling feedback, so that a signal generated by said complex signal processor converges to a constant value.

7. A phase-locked circuit as set forth in claim 6, wherein said complex signal processor comprises a complex signal generation portion for respectively generating said first signal component and said second signal component having a frequency in accordance with said feedback control signal, wherein phases are mutually perpendicular, a first calculation portion for multiplying said first signal component generated by said complex signal generation portion with a real part component of said first complex signal, a second calculation portion for multiplying said second signal component generated by said complex signal generation portion with an imaginary part component of said first complex signal, and a third calculation portion for calculating a sum or difference of multiplication results of said first calculation portion and said second calculation portion.

8. A phase-locked circuit as set forth in claim 5, wherein:

said signal generation portion generates a signal having a 1/k (k indicates positive multiples of 4) cycle for said first signal component and said second signal component;

said fourth calculation portion selects a coefficient value in accordance with an instantaneous value in every 1/k cycle of said first signal component; and said fifth calculation portion selects a coefficient value in accordance with an instantaneous value in every 1/k cycle of said second signal component.

9. A phase-locked circuit as set forth in claim 6, wherein said feedback portion comprises a filter for amplifying a direct-current component of a signal generated by said complex signal processor by a predetermined transmission characteristic and outputting as said feedback control signal.

10. A phase-lock circuit for locking a phase difference of a first output signal and a second output signal to a phase difference in accordance with a first angle based on a first input signal being proportional to a product of a cosine function having a first frequency and a cosine function having the first angle, and a second input signal being proportional to a product of a cosine function having a first frequency and a sine function having the first angle, comprising:

a polarity inversion circuit for inverting a polarity of said second input signal and outputting;

a first phase-locked circuit, wherein said first input signal is input to a first terminal, said second input signal is input to a second terminal, and said first output signal is output;

a second phase-locked circuit, wherein said first input signal is input to a first terminal, an output signal of said polarity inversion circuit is input to second terminal, and said second output signal is output;

wherein said first phase-locked circuit and said second phase-locked circuit respectively comprises:

a complex signal processor for generating a signal in accordance with a declination of a complex signal obtained by multiplying a first complex signal having a signal input to said first terminal as a real part component and a signal input to said second terminal as an imaginary part component with a second complex signal having a frequency in accordance with a feedback control signal to be input, wherein the frequency is set to have a predetermined polarity; and a feedback portion for generating said feedback control signal for controlling feedback in accordance with a signal generated by said complex signal processor, so that said declination converges to a constant value;

wherein said complex signal processor outputs as said first output signal or said second output signal at least one of a first signal component and a second signal component having mutually perpendicular phases included in said second complex signal, or outputs as said first output signal or said second output signal a signal synchronized with one of said first signal component and said second signal component wherein said complex signal processor comprises:

a signal generation portion for generating a signal having a frequency in accordance with said feedback control signal, a fourth calculation portion for selecting for each cycle of a signal generated by said signal generation portion a coefficient value in accordance with an instantaneous value for said first signal component to have in the cycle from a plurality of predetermined coefficient values, and multiplying the selected coefficient value with a real part component of said first complex signal, a fifth calculation portion for selecting for each cycle of a signal generated by said signal generation portion a coefficient value in accordance with an instantaneous value for said second signal component to have in the cycle from a plurality of predetermined coefficient values, and multiplying the selected coefficient value with an imaginary part component of said first complex signal, and a sixth calculation portion for calculating a sum or difference of multiplication results of said fourth calculation portion and said fifth calculation portion.

11. A phase-locked circuit as set forth in claim 10, wherein:

said complex signal processor generates as a signal in accordance with said declination a signal in accordance with a real part or an imaginary part of a complex signal obtained by multiplying said first complex signal with said second complex signal; and said feedback portion generates said feedback control signal for controlling feedback, so that a signal generated by said complex signal processor converges to a constant value.

12. A phase-locked circuit as set forth in claim 11, wherein said complex signal processor comprises a complex signal generation portion for respectively generating said first signal component and said second signal component having a frequency in accordance with said feedback control signal, wherein phases are mutually perpendicular, a first calculation portion for multiplying said first signal component generated by said complex signal generation portion with a real part component of said first complex signal, a second calculation portion for multiplying said second signal component generated by said complex signal generation portion with an imaginary part component of said first complex signal, and a third calculation portion for calculating a sum or difference of multiplication results of said first calculation portion and said second calculation portion.

13. A phase-locked circuit as set forth in claim 10, wherein:

said signal generation portion generates a signal having a 1/k (k indicates positive multiples of 4) cycle for said first signal component and said second signal component;

said fourth calculation portion selects a coefficient value in accordance with an instantaneous value in every 1/k cycle of said first signal component; and said fifth calculation portion selects a coefficient value in accordance with an instantaneous value in every 1/k cycle of said second signal component.

14. A phase-locked circuit as set forth in claim 11, wherein said feedback portion comprises a filter circuit for amplifying a direct-current component of a signal generated by said complex signal processor by a predetermined transmission characteristic and outputting as said feedback control signal.

* * * * *